(12) United States Patent
Park et al.

(10) Patent No.: US 11,737,320 B2
(45) Date of Patent: Aug. 22, 2023

(54) DISPLAY DEVICE WITH ISLANDS AND CONNECTING BRIDGES

(71) Applicant: Samsung Display Co., LTD., Yongin-si (KR)

(72) Inventors: Gwui Hyun Park, Hwaseong-si (KR); Pil Soon Hong, Gwangmyeong-si (KR); Chui Won Park, Hwaseong-si (KR); Hyun Jin Son, Namyangju-si (KR); Koichi Sugitani, Suwon-si (KR); Hyung Bin Cho, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 167 days.

(21) Appl. No.: 16/842,308

(22) Filed: Apr. 7, 2020

(65) Prior Publication Data

US 2020/0388666 A1    Dec. 10, 2020

(30) Foreign Application Priority Data

Jun. 7, 2019  (KR) .................. 10-2019-0067566

(51) Int. Cl.
*H10K 59/131* (2023.01)
*H10K 77/10* (2023.01)
(Continued)

(52) U.S. Cl.
CPC .......... *H10K 59/131* (2023.02); *H10K 77/111* (2023.02); *H10K 59/1201* (2023.02); *H10K 59/35* (2023.02); *H10K 59/38* (2023.02)

(58) Field of Classification Search
CPC ............... H01L 27/3276; H01L 27/323; H01L 27/3211; H01L 27/322; H01L 51/0097;
(Continued)

(56) References Cited

U.S. PATENT DOCUMENTS

2014/0145155 A1*  5/2014  Park ............... H01L 51/5253
                                                                   257/40
2014/0217397 A1*  8/2014  Kwak ............. H01L 27/1218
                                                                   257/43
(Continued)

FOREIGN PATENT DOCUMENTS

CN    108461531       8/2018
KR    10-2017-0109179  9/2017
KR    10-2018-0136652  12/2018

OTHER PUBLICATIONS

Extended European Search Report corresponding to European Patent Application or Patent No. 20177448.6 dated Oct. 22, 2020.

*Primary Examiner* — Lex H Malsawma
*Assistant Examiner* — Eric W Jones
(74) *Attorney, Agent, or Firm* — Kile Park Reed & Houtteman PLLC

(57) ABSTRACT

A display device comprises: a base layer, islands and bridges, the islands and the bridges disposed on the base layer, the bridges connecting the islands to each other, first wirings disposed on the bridges, pixels disposed on the islands, the first wirings disposed on the bridges, pixels disposed on the islands, the first wirings being connected to the pixels; an inorganic insulating layer disposed on the base layer, the inorganic insulating layer includes an opening exposing the base layer of a bridge region having the bridges; second wirings disposed in the opening; and a first organic insulating layer disposed between the first wirings and the second wirings, where the first wirings and the second wirings are connected to each other through first contact holes formed in the first organic insulating layer.

26 Claims, 25 Drawing Sheets

(51) Int. Cl.
  *H10K 59/35* (2023.01)
  *H10K 59/38* (2023.01)
  *H10K 59/12* (2023.01)

(58) Field of Classification Search
  CPC ............ H01L 2227/323; H10K 59/131; H10K
           59/1201; H10K 59/35; H10K 59/38;
                        H10K 77/111
  USPC ..................................................... 257/40, 59
  See application file for complete search history.

(56) References Cited

U.S. PATENT DOCUMENTS

| | | |
|---|---|---|
| 2018/0114825 A1 | 4/2018 | Hong et al. |
| 2018/0145125 A1* | 5/2018 | Lee ..................... H01L 27/3262 |
| 2018/0182838 A1* | 6/2018 | Yeo ..................... H01L 51/5253 |
| 2019/0326383 A1* | 10/2019 | Yamanaka .......... H01L 27/3276 |

\* cited by examiner

DISPLAY DEVICE WITH ISLANDS AND CONNECTING BRIDGES

CROSS-REFERENCE TO RELATED APPLICATION

This application claims priority to and benefits of Korean Patent Application No. 10-2019-0067566 under 35 U.S.C. § 119, filed in the Korean Intellectual Property Office on Jun. 7, 2019, the entire contents of which are incorporated herein by reference.

BACKGROUND

1. Technical Field

Aspects of some example embodiments of the disclosure relate to a display device.

2. Description of the Related Art

Display devices are becoming increasingly important with the continual development of multimedia. Accordingly, various types of display devices such as liquid crystal display devices and organic light emitting diode display devices are being developed.

Of the display devices, an organic light emitting diode display device includes organic light emitting elements which are self-light emitting elements. Each of the self-light emitting elements may include two electrodes facing each other and an organic light emitting layer interposed between the two electrodes. Electrons and holes provided from the two electrodes may recombine in the organic light emitting layer to generate excitons. As the generated excitons change from an excited state to a ground state, light may be emitted.

Recently, display devices that are bendable, foldable, or stretchable have been developed. With respect to a stretchable display device, light emitting elements are formed on a stretchable substrate. However, when the substrate is stretched, the light emitting elements or wirings stacked on the substrate may be damaged.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of some example embodiments of the disclosure including a display device which can minimize defects such as a disconnection or a crack of a wiring when a stretchable substrate is repeatedly stretched or contracted.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to some example embodiments of the disclosure, a display device comprises: a base layer, a plurality of islands and a plurality of bridges, the plurality of islands and the plurality of bridges are disposed on the base layer, the plurality of bridges connecting the islands to each other, first wirings disposed on the plurality of bridges, a plurality of pixels disposed on the plurality of islands, the first wirings connected to the plurality of pixels; an inorganic insulating layer disposed on the base layer, the inorganic insulating layer comprises an opening exposing the base layer of a bridge region including the bridges; second wirings disposed in the opening; and a first organic insulating layer disposed between the first wirings and the second wirings, wherein the first wirings and the second wirings are connected to each other through a plurality of first contact holes formed in the first organic insulating layer.

The inorganic insulating layer may be disposed mainly on the plurality of islands of the base layer and the first organic insulating layer may be disposed mainly on the plurality of bridges of the base layer.

The display device may further comprise a plurality of pixel bridge wirings which connect at least one pixel of the plurality of pixels to the first wirings.

At least one inorganic insulating layer may be disposed between the first wirings and the pixel bridge wirings, and the first wirings and the pixel bridge wirings may be connected through a plurality of second contact holes formed in the at least one inorganic insulating layer.

The second wirings may be made of the same material as the pixel bridge wirings.

The second wirings may comprise any one of niobium-aluminum (Nb/Al), tantalum-aluminum (Ta/Al), titanium-titanium nitride-aluminum (Ti/TiN/Al), and titanium-aluminum-titanium (Ti/Ai/Ti).

Resistivity of the first wirings may be substantially the same as resistivity of the second wirings.

A height of the first wirings in a thickness direction may be substantially the same as a height of the second wirings in the thickness direction.

The first wirings and the second wirings may overlap in the opening in a thickness direction.

The islands may have a quadrilateral shape, and at least one bridge of the plurality of bridges is connected to one side of at least one island of the plurality of islands.

A second organic insulating layer may be disposed on the first organic insulating layer and the first wirings.

A thin-film encapsulation layer may be disposed on the second organic insulating layer.

The display device may further comprise third wirings between the second wirings and the base layer of the opening.

The second wirings and the third wirings overlap in a thickness direction.

A sum of a height of the second wirings in the thickness direction and a height of the third wirings in the thickness direction may be substantially equal to a height of the first wirings in the thickness direction.

The base layer may comprise a groove, which is formed lower than an upper surface of the base layer, in a part of the bridge region.

The second wirings and the first organic insulating layer may be disposed in the groove.

The inorganic insulating layer may comprise a buffer layer, a gate insulating layer, and at least one interlayer insulating film stacked sequentially.

Each of the pixels of the plurality of pixels may comprise a transistor, and the transistor may comprise a semiconductor layer provided on the buffer layer, a gate electrode provided on the gate insulating layer, and a source electrode and a drain electrode formed on the interlayer insulating film.

The first wirings may be made of a same material as a material contained in the source electrode and the drain electrode.

The second wirings may be made of a same material as the gate electrode.

Each of the plurality of pixels may include a switching transistor, a driving transistor, a storage capacitor, and an organic light emitting diode, wherein the organic light emitting diode may include an organic material that emits light of any one or more of primary colors of red, green and blue and the display device may display an image using a spatial sum of the primary colors.

According to the aforementioned and other embodiments of the disclosure, a display device according to an embodiment can minimize defects such as a disconnection or a crack of a wiring when a stretchable substrate is repeatedly stretched or contracted.

Other features and embodiments may be apparent from the following detailed description, the drawings, and the claims.

BRIEF DESCRIPTION OF THE DRAWINGS

The above and other embodiments and aspects of the disclosure will become more apparent by describing in more detail embodiments thereof with reference to the accompanying drawings, in which.

DETAILED DESCRIPTION OF THE EMBODIMENTS

Figure 1:
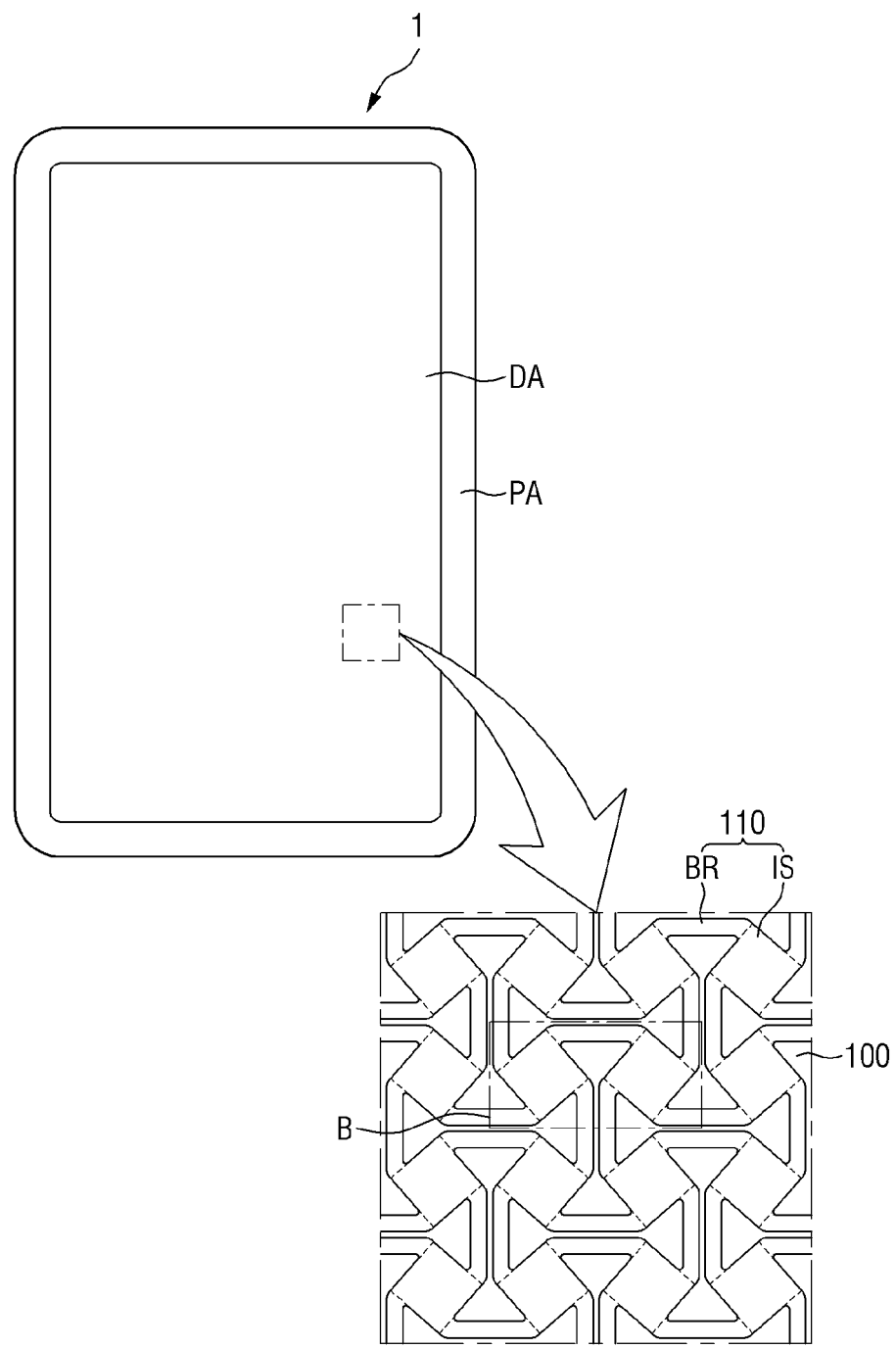
FIG. 1 is a schematic plan view of a display device according to an embodiment.

Aspects of some example embodiments will now be described more fully hereinafter with reference to the accompanying drawings, in which example embodiments are shown. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

To clearly describe the embodiments, parts that are irrelevant to the description are omitted, and like numerals refer to like or similar constituent elements throughout the disclosure.

Further, since sizes and thicknesses of constituent members shown in the accompanying drawings may be arbitrarily given for better understanding and ease of description, the embodiments may not be limited to the illustrated sizes and thicknesses.

In the figures, the thicknesses of layers, films, panels, regions, etc., may be exaggerated for clarity. In the figures, for better understanding and ease of description, the thicknesses of some layers and areas may be exaggerated.

It will be understood that when an element such as a layer, film, region, or substrate may be referred to as being "on" another element, it may be directly on the other element or intervening elements may also be present. In contrast, when an element is referred to as being "directly on" another element, there may be no intervening elements present. The word "over" or "on" means positioning on or below an object portion, and does not necessarily mean positioning on the upper side of the object portion based on a gravity direction.

Unless explicitly described to the contrary, the word "comprise" and variations such as "comprises" or "comprising" will be understood to imply the inclusion of stated elements but not the exclusion of any other elements. As used herein, the term "and/or" may include any and all combinations of one or more of the associated listed items. Expressions such as "at least one of," when preceding a list of elements, modify the entire list of elements and do not modify the individual elements of the list.

In a case that a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

It will be understood that the terms "first," "second," etc. may be used herein to describe various components, these components should not be limited by these terms. These terms may only be used to distinguish one component from another.

As used herein, the singular forms "a," "an," and "the" are intended to include the plural forms as well, unless the context clearly indicates otherwise.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it may be directly or indirectly in contact with or electrically connected to the other element, area, or layer.

Further, the phrase "in a plan view" means when an object portion is viewed from above, and the phrase "in a schematic cross-sectional view" means when a schematic cross-section taken by vertically cutting an element portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity. The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

Hereinafter, aspects of some example embodiments will be described with reference to the accompanying drawings.

FIG. 1 is a schematic plan view of a display device 1 according to an embodiment.

Referring to FIG. 1, the display device 1 includes a display area DA and a peripheral area PA.

The display area DA is an area that substantially displays a screen. In the display area DA, a thin-film transistor, an organic light emitting element, etc. may be located in each pixel. In each pixel, the organic light emitting element may emit light to display an image on a screen.

The peripheral area PA surrounds the display area DA. Driving circuits, driving chips, various wirings and printed circuit boards, etc. may be located in the peripheral area PA to supply power and display signals. For example, a gate driver, a data driver, etc. may be located in the peripheral area PA to transmit predetermined signals for driving the display area DA.

Referring to an enlarged view of area A of the display area DA, the display device 1 may include a base layer 110 on a substrate 100. The base layer 110 may include slands IS and bridges BR.

The substrate 100 may be a structure that supports the base layer 110 formed thereon. The substrate 100 may be stretchable and thus may be elongated or shortened. The base layer 110 may be structured to be stretched when the substrate 100 is stretched.

The substrate 100 may be made of an insulating material such as glass or resin. The substrate 100 may be made of a material having flexibility so as to be bendable or foldable and may have a single-layer structure or a multilayer structure.

For example, the substrate 100 may include at least any one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 100 may include any suitable material that is appreciated or understood by those of ordinary skill in the art.

The base layer 110 may be located on the substrate 100 and may be made of polyimide, polyamide, polyacrylates, or the like and may include any suitable material that is appreciated or understood by those of ordinary skill in the art.

Figure 2:
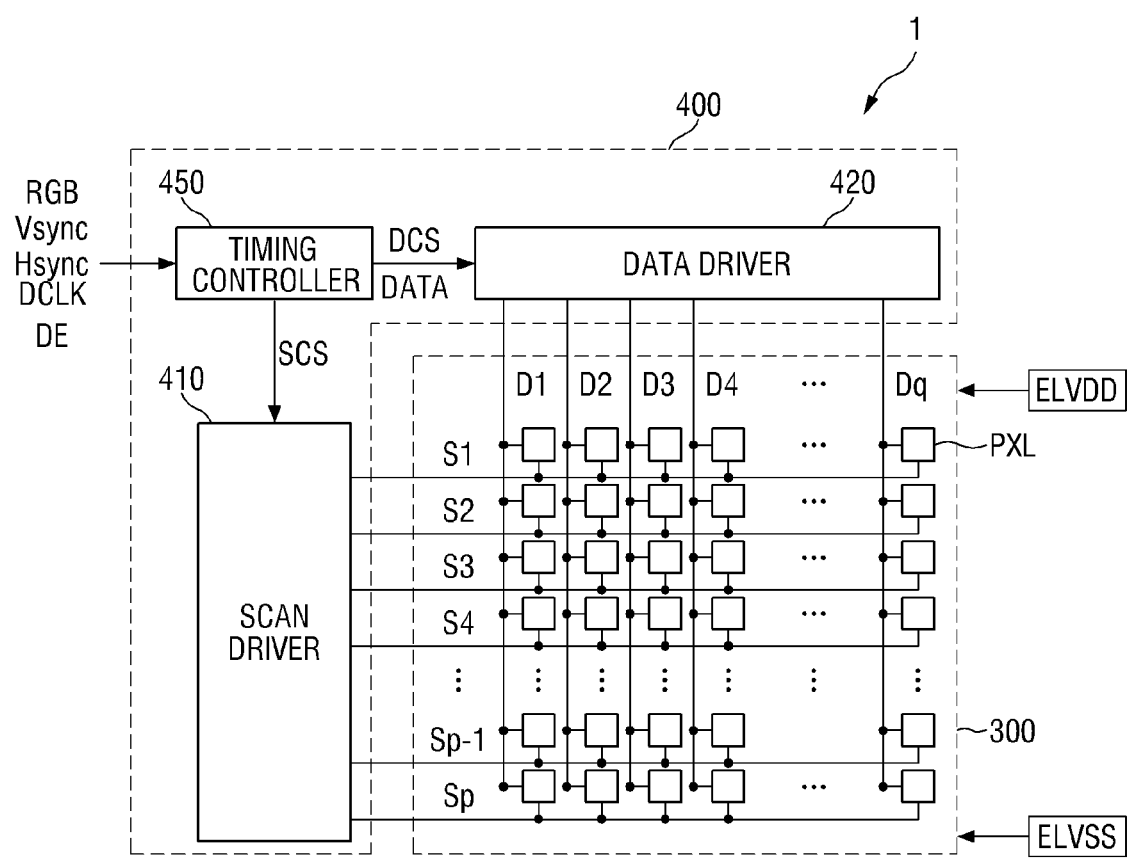
FIG. 2 is a schematic block diagram of an organic light emitting display device according to an embodiment.

FIG. 2 is a schematic block diagram of an organic light emitting display device 1 according to an embodiment.

Referring to FIG. 2, the organic light emitting display device 1 according to the embodiment may include a display panel 300 and a display driving unit 400.

The display panel 300 may include pixels PXL and data lines D1 through Dq and scan lines S1 through Sp connected to the pixels PXL.

The pixels PXL may receive data signals and scan signals through the data lines D1 through Dq and the scan lines S1 through Sp, respectively.

The pixels PXL may be connected to first power ELVDD and second power ELVSS.

Each of the pixels PXL may include a light emitting element and generate light corresponding to a data signal by using a current flowing from the first power ELVDD to the second power ELVSS via the light emitting element.

The display driving unit 400 may include a scan driver 410, a data driver 420, and a timing controller 450.

The scan driver 410 may supply scan signals to the scan lines S1 through Sp in response to a scan driver control signal SCS. For example, the scan driver 410 may sequentially supply the scan signals to the scan lines S1 through Sp.

To be connected to the scan lines S1 through Sp, the scan driver 410 may be mounted directly on a substrate 100 having the pixels PXL or may be connected to the substrate 100 through a separate element such as a flexible circuit board.

The data driver 420 may receive a data driver control signal DCS and image data DATA from the timing controller 450 and generate data signals.

The data driver 420 may supply the generated data signals to the data lines D1 through Dq.

To be connected to the data lines D1 through Dq, the data driver 420 may be mounted directly on the substrate 100 having the pixels PXL or may be connected to the substrate 100 through a separate element such as a flexible circuit board.

When a scan signal is supplied to a specific or selected scan line, some pixels PXL connected to the specific or selected scan line may receive data signals from the data lines D1 through Dq and may emit light at luminance levels corresponding to the received data signals.

The timing controller 450 may generate control signals for controlling the scan driver 410 and the data driver 420.

For example, the control signals may include the scan driver control signal SCS for controlling the scan driver 410 and the data driver control signal DCS for controlling the data driver 420.

Here, the timing controller 450 may generate the scan driver control signal SCS and the data driver control signal DCS using external input signals.

For example, the external input signals may include a dot clock DCLK, a data enable signal DE, a vertical synchronization signal Vsync, and a horizontal synchronization signal Hsync.

For example, the timing controller 450 may supply the scan driver control signal SCS to the scan driver 410 and supply the data driver control signal DCS to the data driver 420.

The timing controller 450 may convert image data RGB received from the outside into the image data DATA conforming to specifications of the data driver 420 and supply the image data DATA to the data driver 420.

The data enable signal DE is a signal for defining a period during which valid data is input. A cycle of the data enable signal DE may be set to one horizontal period as same as a cycle of the horizontal synchronization signal Hsync.

In FIG. 2, the scan driver 410, the data driver 420, and the timing controller 450 are illustrated separately. However, at least some of these elements may be integrated as would be appreciated by those of ordinary skill in the art.

The scan driver 410, the data driver 420, and the timing controller 450 may be installed using various methods such as chip-on-glass, chip-on-plastic, tape carrier package, and chip-on-film.

Figure 3:
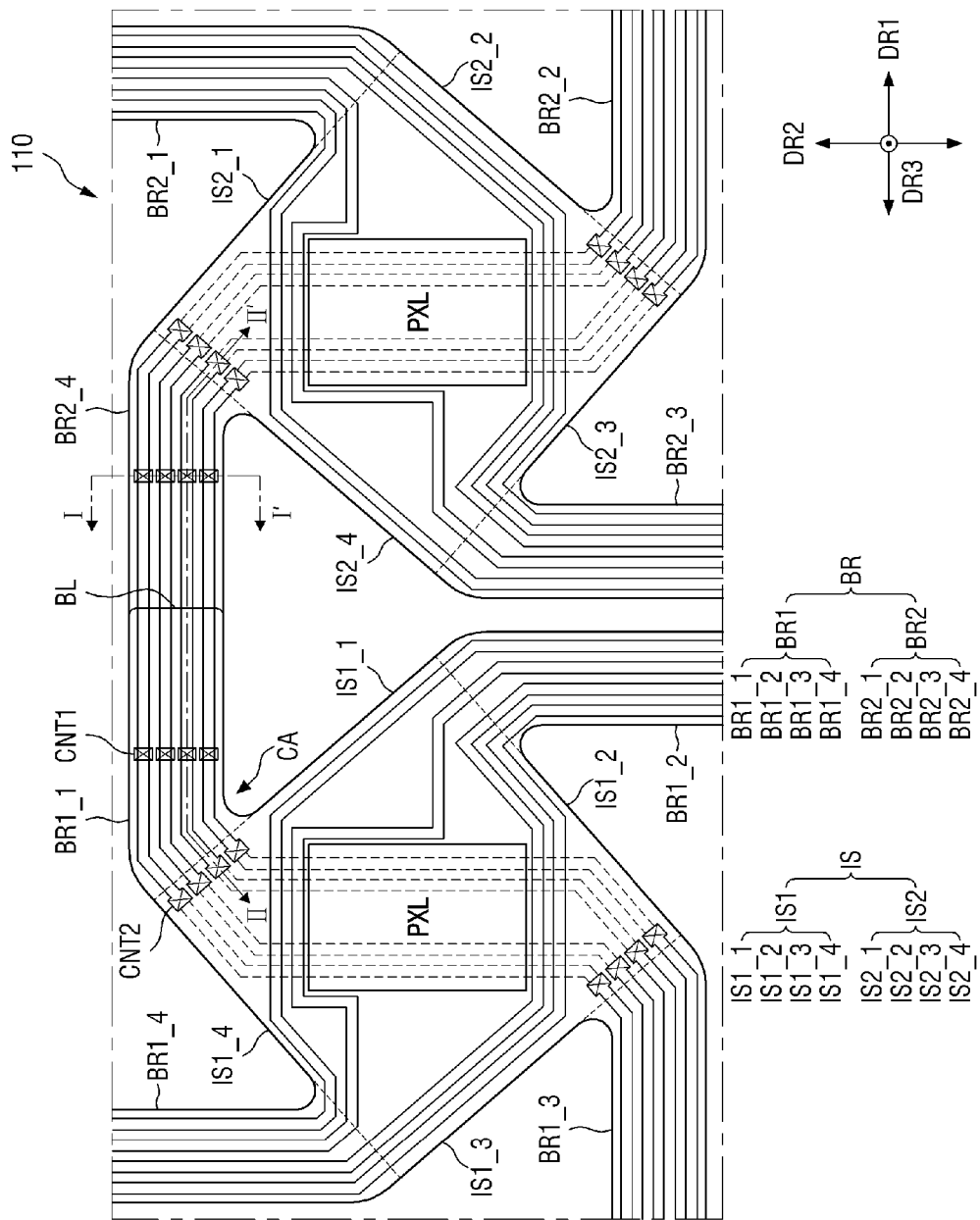
FIG. 3 is an enlarged view of area B of FIG. 1, illustrating a base layer of the display device according to an embodiment.

FIG. 3 is an enlarged view of area B of FIG. 1, illustrating the base layer 110 of the display device 1 according to the embodiment.

Referring to FIG. 3, the base layer 110 may be provided on the substrate 100 and may be formed in an island shape. The base layer 110 may include islands IS and bridges BR.

For example, the islands IS may be arranged regularly along a first direction DR1 and a second direction DR2. For example, adjacent islands IS may be connected to each other by at least any one bridge BR.

A pixel structure (e.g., a thin-film transistor, a capacitor, an organic light emitting diode, etc.) may be formed on each island IS. One pixel PXL may be formed on each island IS, or any number of pixels PXL may be formed on each island IS.

Wirings BL for supplying a power supply voltage, a data signal, a scan signal, etc. to the pixel structure may be formed on each bridge BR.

When the substrate 100 is stretched, a distance between the islands IS may increase or decrease. Accordingly, the shape of each island IS may not be changed. For example, the width and height of each island IS may not increase or decrease. Therefore, the structure of the pixels PXL formed on the islands IS may not be changed.

However, when the substrate 100 is stretched, the shape of each bridge BR connecting the islands IS may be changed.

Although each island IS may have a quadrilateral shape in FIG. 3, embodiments are not limited to this case, and the shape of each island IS can be changed to various shapes. For example, each island IS can have a polygonal shape such as a pentagon or a hexagon. For example, the shape of each bridge BR connecting the islands IS is not limited to the shape illustrated in FIG. 3 and can be changed to various shapes.

The pixels PXL may be formed on each of the islands IS. One pixel PXL may be formed on one island IS, or any number of pixels PXL may be formed on one island IS. For example, when the pixel may include red pixels R, green pixels G, and blue pixels B, red pixels R, green pixels G, and blue pixels B may be provided on each island IS.

A first island IS1 may be shaped like a quadrilateral having first through fourth sides IS1_1 through IS1_4. First through fourth bridges BR1_1 through BR1_4 may be connected to the first through fourth sides IS1_1 through IS1_4 of the first island IS1, respectively.

The first bridge BR1_1 may be connected to a portion of the first side IS1_1 and may extend along the first direction DR1. The first bridge BR1_1 may include a curved portion CA at a position where it is connected to the first side IS1_1.

The second bridge BR1_2 may be connected to a portion of the second side IS1_2 and may extend along the second direction DR2. The second bridge BR1_2 may include a curved portion CA at a position where it is connected to the second side IS1_2.

The third bridge BR1_3 may be connected to a portion of the third side IS1_3 and may extend along the first direction DR1. The third bridge BR1_3 may extend in a direction opposite to the direction in which the first bridge BR1_1 extends. The third bridge BR1_3 may include a curved portion CA at a position where it is connected to the third side IS1_3.

The fourth bridge BR1_4 may be connected to a portion of the fourth side IS1_4 and may extend along the second direction DR2. The fourth bridge BR1_4 may extend in a direction opposite to the direction in which the second bridge BR1_2 extends. The fourth bridge BR1_4 may include a curved portion CA at a position where it is connected to the fourth side IS1_4.

A second island IS2 may be shaped like a quadrilateral having first through fourth sides IS2_1 through IS2_4. First through fourth bridges BR2_1 through BR2_4 may be connected to the first through fourth sides IS2_1 through IS2_4 of the second island IS2, respectively.

The first bridge BR2_1 may be connected to a portion of the first side IS2_1 and may extend along the second direction DR2. The first bridge BR2_1 may include a curved portion CA at a position where it is connected to the first side IS2_1.

The second bridge BR2_2 may be connected to a portion of the second side IS2_2 and may extend along the first direction DR1. The second bridge BR2_2 may include a curved portion CA at a position where it is connected to the second side IS2_2.

The third bridge BR2_3 may be connected to a portion of the third side IS2_3 and may extend along the second direction DR2. The third bridge BR2_3 may extend in a direction opposite to the direction in which the first bridge BR2_1 extends. The third bridge BR2_3 may include a curved portion CA at a position where it is connected to the third side IS2_3.

The fourth bridge BR2_4 may have an end connected to a portion of the fourth side IS2_4 and the other end connected to the first bridge BR1_1 of the adjacent first island IS1. The fourth bridge BR2_4 and the first bridge BR1_1 of the adjacent first island IS1 may extend along the first direction DR1 to be connected to each other. The fourth bridge BR2_4 may include a curved portion CA at a position where it is connected to the fourth side IS2_4.

The wirings BL for supplying a driving voltage, a scan signal, a data signal, etc. to a pixel PXL formed on an island IS may be formed on each bridge BR.

The number of the wirings BL provided on each bridge BR may vary according to the number of the pixels PXL formed on each island IS or may vary according to the number of transistors that constitute a pixel PXL.

For example, the number of the wirings BL provided on each bridge BR may be the same or different.

Figure 8:
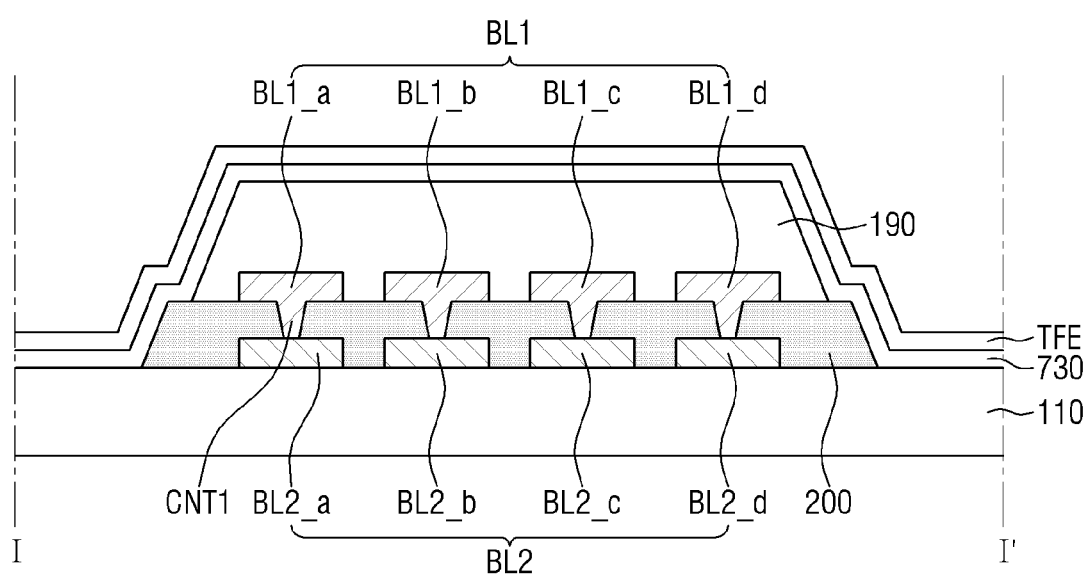
FIG. 8 is a schematic cross-sectional view taken along line I-I' of FIG. 3.
Figure 8:
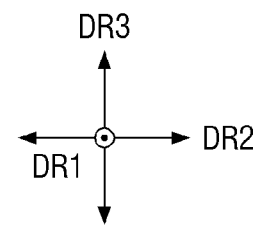
Figure 9:
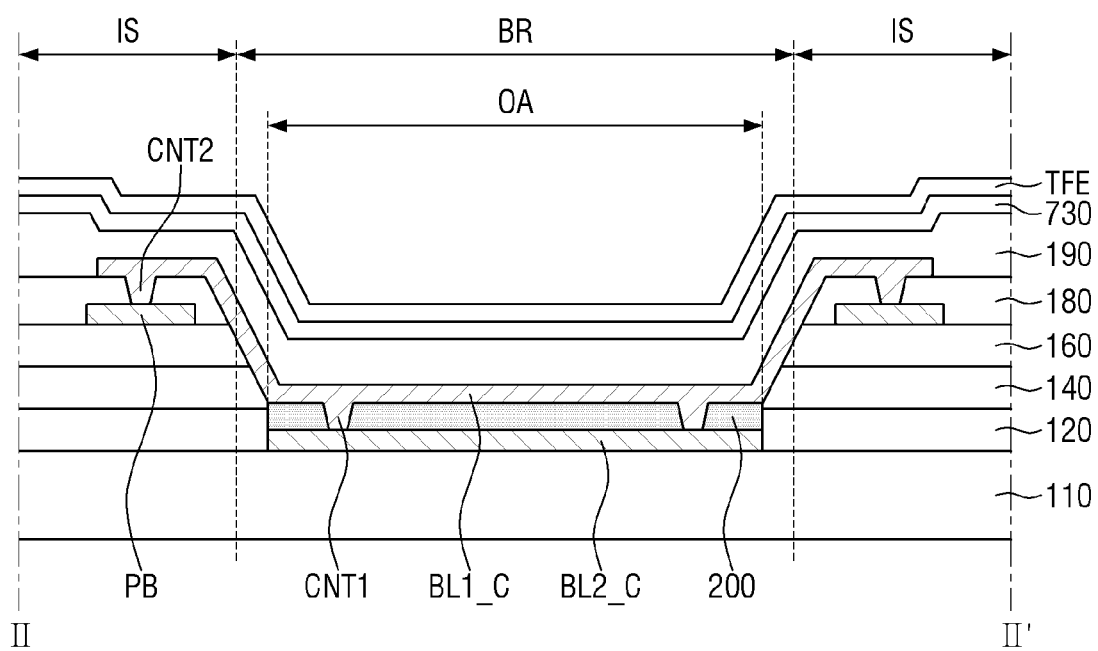
FIG. 9 is a schematic cross-sectional view taken along line II-II' of FIG. 3.
Figure 9:
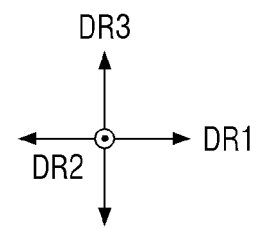

Referring to FIGS. 8 and 9, the wirings BL provided on each bridge BR may include first wirings BL1 and second wirings BL2. The first wirings BL1 and the second wirings BL2 may overlap each other in a third direction DR3. An insulating layer 200 may be disposed between the first wirings BL1 and the second wirings BL2.

According to an embodiment, the insulating layer may be a second protective layer 200. The second protective layer 200 may include first contact holes CNT1 that may partially expose the second wirings BL2. The first wirings BL1 and the second wirings BL2 may be physically and electrically connected through the first contact holes CNT1.

The first wirings BL1 disposed on the first bridge BR1_1 of the first island IS1 may be connected to the first wirings BL1 disposed on the third bridge BR1_3 by pixel bridge wirings PB.

According to an embodiment, the pixel bridge wirings PB may traverse a pixel PXL formed on the first island IS1. The pixel bridge wirings PB may be disposed on a different layer from the first wirings BL1 disposed on the bridges BR. As illustrated in FIGS. 8 and 9, the pixel bridge wirings PB may be disposed on a first interlayer insulating film 160, and the first wirings BL1 may be disposed on a second interlayer insulating film 180. In the second interlayer insulating film 180, second contact holes CNT2 partially exposing the pixel bridge wirings PB may be formed.

The first wirings BL1 disposed on the second bridge BR1_2 of the first island IS1 may bypass the pixel PXL formed on the first island IS1 and may be directly connected to the first wirings BL1 disposed on the fourth bridge BR1_4 of the first island IS1.

Although the pixel bridge wirings PB traversing the pixel PXL and the first wirings BL1 bypassing the pixel PXL are schematically illustrated for ease of description, the pixel bridge wirings PB and the first wirings BL1 bypassing the pixel PXL may be physically and/or electrically connected to the pixel PXL through contact holes.

Figure 4:
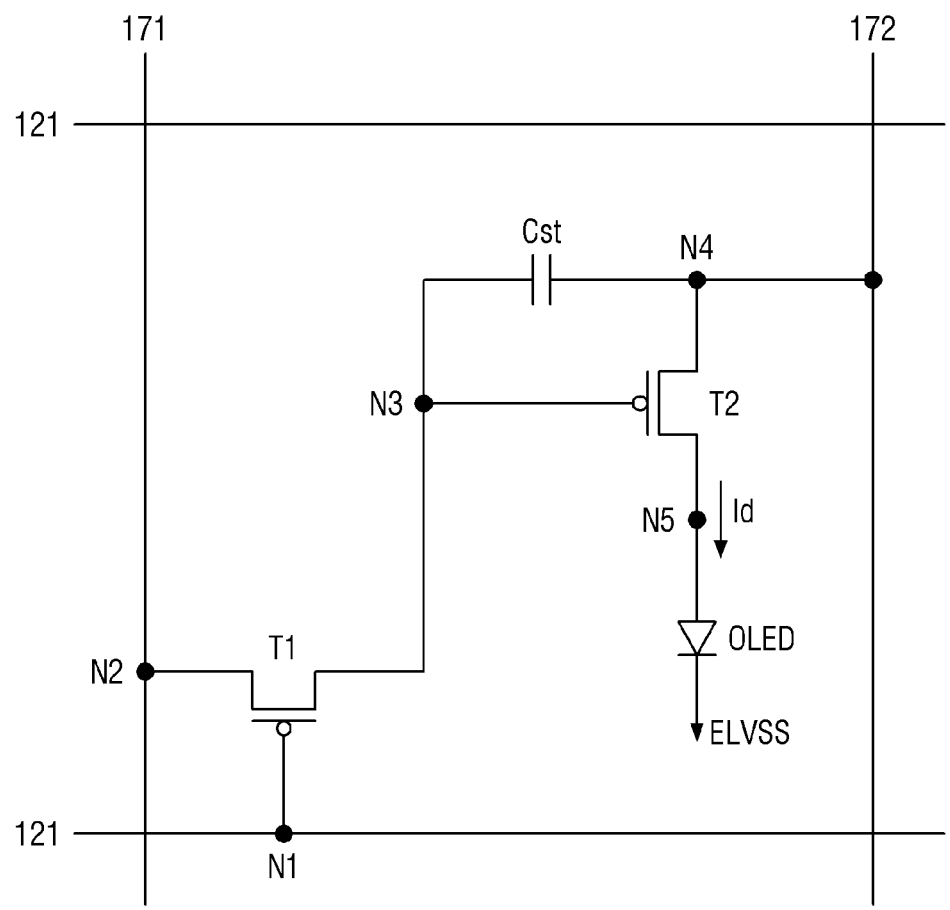
FIG. 4 is a schematic diagram of an equivalent circuit of a pixel according to an embodiment.

Referring to FIGS. 2 and 3, the first wirings BL1 disposed on the first bridge BR1_1 of the first island IS1, the pixel bridge wirings PB, and the first wirings BL1 disposed on the third bridge BR1_3 may be scan lines 121 (as shown in FIG. 4) for transmitting scan signals. The first wirings BL1 disposed on the second bridge BR1_2 of the first island IS1 and the first wirings BL1 disposed on the fourth bridge BR1_4 may be a data line 171 (as shown in FIG. 4) for transmitting a data signal and a driving voltage line 172 (as shown in FIG. 4) for transmitting a driving voltage.

However, embodiments are not limited thereto. For example, the first wirings BL1 disposed on the first bridge BR1_1 of the first island IS1, the pixel bridge wirings PB, and the first wirings BL1 disposed on the third bridge BR1_3 may be the data line 171 for transmitting a data signal and the driving voltage line 172 for transmitting a driving voltage, and the first wirings BL1 disposed on the second bridge BR1_2 of the first island IS1 and the first wirings BL1 disposed on the fourth bridge BR1_4 may be the scan lines 121 for transmitting scan signals.

The structure of the first and second wirings BL1 and BL2 formed on the bridges BR will be described in detail with reference to FIGS. 8 and 9.

Figure 5:
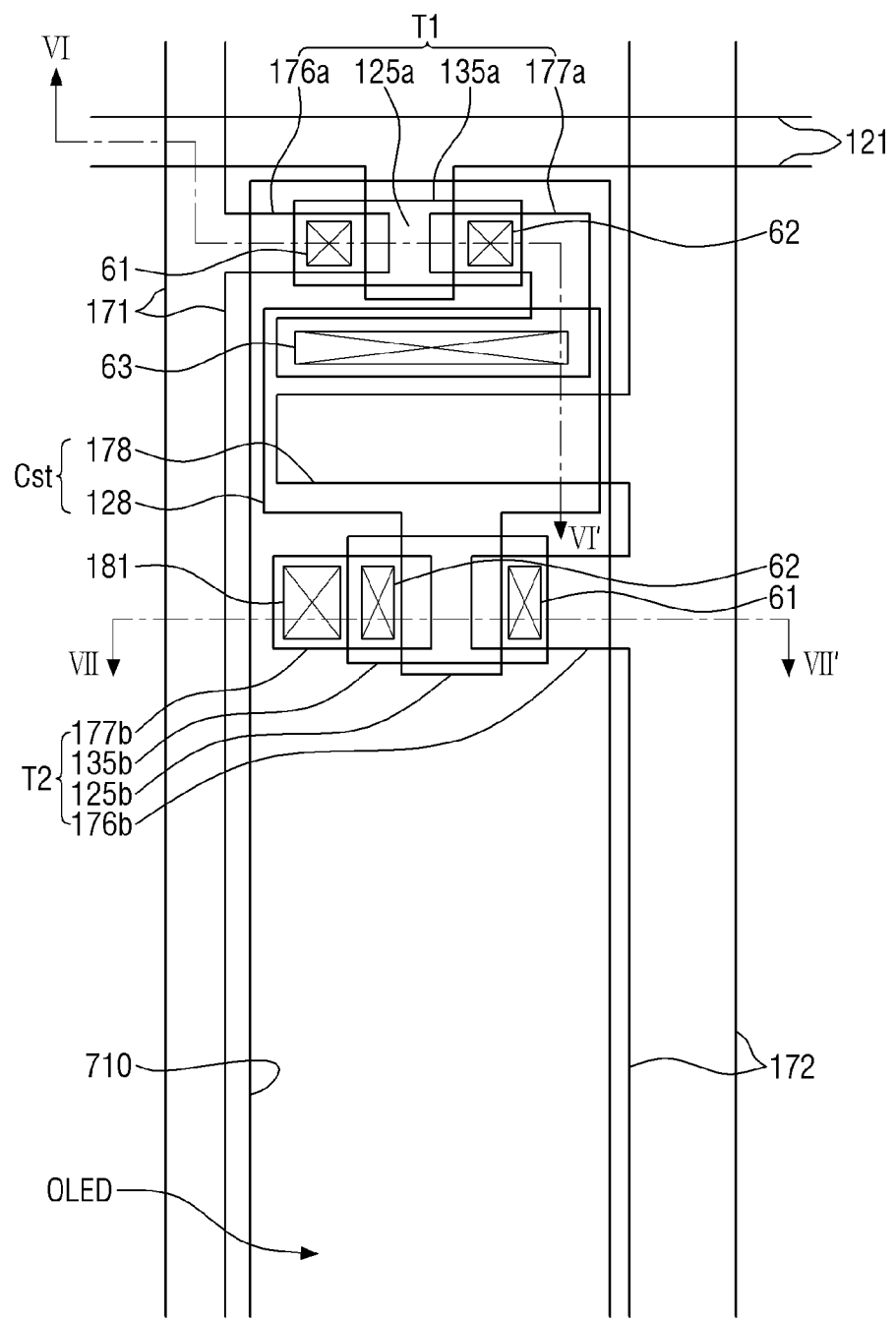
FIG. 5 is a plan view of the pixel illustrated in FIG. 4.
Figure 6:
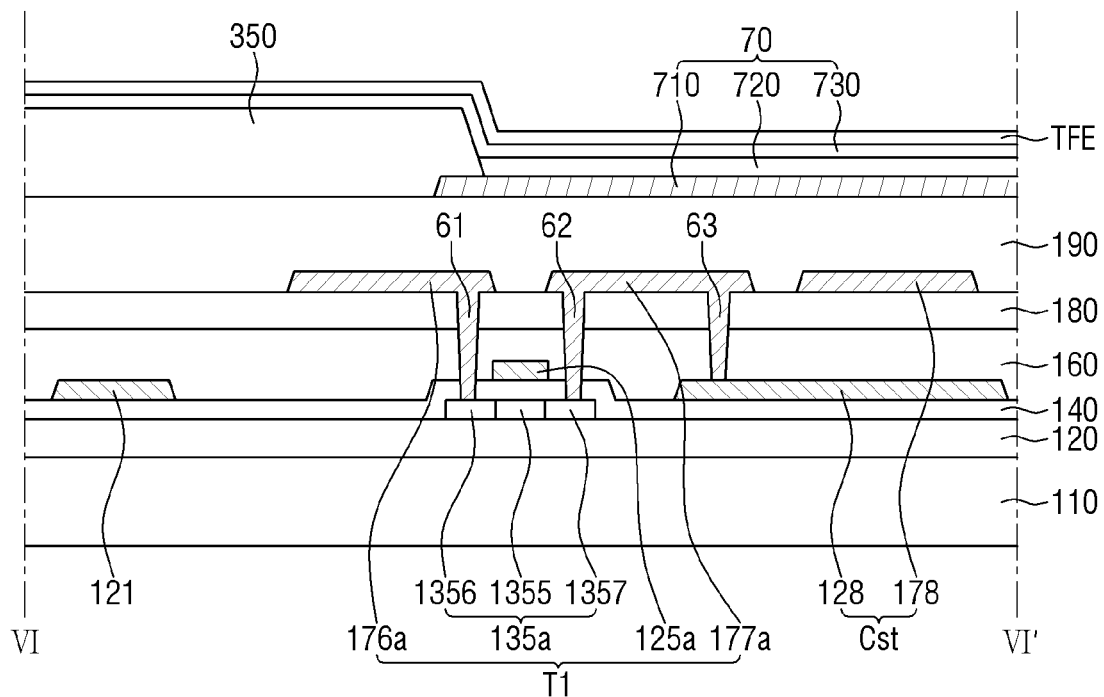
FIG. 6 is a schematic cross-sectional view taken along line VI-VI' of FIG. 5.
Figure 7:
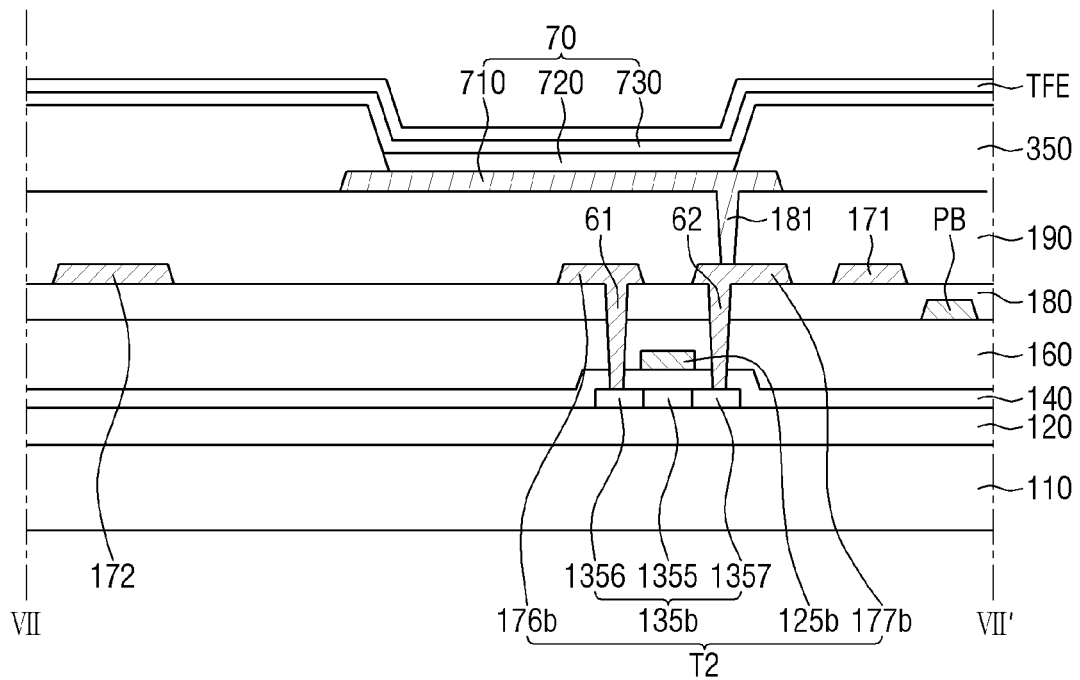
FIG. 7 is a schematic cross-sectional view taken along line VII-VII' of FIG. 5.

FIG. 4 is a schematic diagram of an equivalent circuit of a pixel PXL according to an embodiment. FIG. 5 is a plan view of the pixel PXL illustrated in FIG. 4. FIG. 6 is a schematic cross-sectional view taken along line VI-VI' of FIG. 5. FIG. 7 is a schematic cross-sectional view taken along line VII-VII' of FIG. 5.

The structure of a pixel PXL formed on an island IS will now be described in detail with reference to FIGS. 4 through 7.

First, a schematic diagram of an equivalent circuit of a pixel PXL formed on each island IS will be described with reference to FIG. 4.

Referring to FIG. 4, the pixel PXL may include a scan line 121 for transmitting a scan signal, a data line 171 for transmitting a data signal, and a driving voltage line 172 for transmitting a driving voltage.

The scan line 121 illustrated in FIG. 4 may be any one of the scan lines S1 through Sp illustrated in FIG. 2, the data line 171 may be any one of the data lines D1 through Dq illustrated in FIG. 2, and the driving voltage line 172 may be a line for supplying the first power ELVDD of FIG. 2.

The pixel PXL may include a switching transistor T1, a driving transistor T2, a storage capacitor Cst, and an organic light emitting diode OLED.

The switching transistor T1 may include a gate electrode, a first electrode and a second electrode and may be connected to a first node N1, a second node N2 and a third node N3. For example, the switching transistor T1 may have the first electrode connected to the second node N2, the second electrode connected to the third node N3, and the gate electrode connected to the first node N1.

Here, the first node N1 may be connected to the scan line 121, the second node N2 may be connected to the data line 171, and the third node N3 may be connected to the driving transistor T2.

The switching transistor T1 may be turned on when receiving a scan signal from the scan line 121 and may supply a data signal received from the data line 171 to the storage capacitor Cst.

Here, the storage capacitor Cst may be charged with a voltage corresponding to the data signal.

The driving transistor T2 may include a gate electrode, a first electrode and a second electrode and may be connected to the third node N3, a fourth node N4 and a fifth node N5.

For example, the driving transistor T2 may have the gate electrode connected to the third node N3, the first electrode connected to the fourth node N4 and the second electrode connected to the fifth node N5.

Here, the third node N3 may be connected to the second electrode of the switching transistor T1, the fourth node N4 may be connected to the driving voltage line 172, and the fifth node N5 may be connected to an anode of the organic light emitting diode OLED.

The driving transistor T2 may control the amount of current Id flowing from the driving voltage line 172 to the organic light emitting diode OLED according to the value of the voltage stored in the storage capacitor Cst.

The organic light emitting diode OLED may include the anode connected to the second electrode of the driving transistor T2 and a cathode connected to the second power ELVSS.

The organic light emitting diode OLED may generate light corresponding to the amount of current Id received from the driving transistor T2.

The organic light emitting diode OLED may include an organic material that uniquely emits light of any one or more of primary colors such as three primary colors of red, green and blue. The organic light emitting display device 1 may display a desired image using the spatial sum of these colors.

In FIG. 4, the first electrode of each of the transistors T1 and T2 may be set as any one of a source electrode and a drain electrode, and the second electrode of each of the transistors T1 and T2 may be set as another electrode different from the first electrode. For example, when the first electrode is set as the source electrode, the second electrode may be set as the drain electrode. Similarly, when the first electrode may be set as the drain electrode, the second electrode may be set as the source electrode For example, although the transistors T1 and T2 are illustrated as p-channel metal oxide semiconductor (PMOS) transistors in FIG. 4, they may also be implemented as n-channel metal oxide semiconductor (NMOS) transistors in other embodiments.

The structure of the pixel PXL illustrated in FIG. 4 is merely an embodiment, and the pixel PXL of the disclosure is not limited to this structure. The pixel PXL may have a circuit structure that can supply a current to the organic light emitting diode OLED, and any one of various structures as would be appreciated and understood by those of ordinary skill in the art may be selected as the structure of the pixel PXL.

For example, a transistor and a capacitor for compensating the current Id supplied to the organic light emitting diode OLED may be provided along with the switching transistor T1 and the driving transistor T2 illustrated in FIG. 4.

The first power ELVDD supplied through the driving voltage line 172 may be a high potential voltage, and the second power ELVSS may be a low-potential voltage.

For example, the first power ELVDD may be set to a positive voltage, and the second power ELVSS may be set to a negative voltage or a ground voltage.

The stacked structure of a pixel PXL formed on an island IS will now be described in detail with reference to FIGS. 5 through 7.

A base layer 110 may be located on a substrate 100 and may be made of polyimide, polyamide, polyacrylates, or any other suitable material known or appreciated by those of ordinary skill in the art.

A buffer layer 120 including an inorganic material such as silicon oxide, silicon nitride and/or silicon oxynitride may be disposed on the base layer 110.

The buffer layer 120 may increase the smoothness of an upper surface of the base layer 110 or prevent or minimize the penetration of impurities from the base layer 110 into a switching semiconductor layer 135a of a thin-film transistor T1.

The buffer layer 120 may have a single-layer structure or a multilayer structure.

The switching semiconductor layer 135a and a driving semiconductor layer 135b may be formed on the buffer layer 120 to be spaced apart from each other.

These switching and driving semiconductor layers 135a and 135b may be made of polysilicon or an oxide semiconductor.

The oxide semiconductor may include any one of an oxide based on titanium (Ti), hafnium (Hf), zirconium (Zr), aluminum (Al), tantalum (Ta), germanium (Ge), zinc (Zn), gallium (Ga), tin (Sn) or indium (In) and complex oxides of these materials such as zinc oxide (ZnO), indium-gallium-zinc oxide (InGaZnO$_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O) and hafnium-indium-zinc oxide (Hf—In—Zn—O).

When the switching and driving semiconductor layers 135a and 135b are made of the oxide semiconductor, a protective layer may be provided to protect the oxide semiconductor which is vulnerable to the external environment such as high temperature.

Each of the switching semiconductor layer 135a and the driving semiconductor layer 135b may be divided into a channel region 1355 not doped with impurities and a source region 1356 and a drain region 1357 which are disposed on both sides of the channel region 1355 and doped with impurities. Here, the impurities may vary depending on the type of thin-film transistor and may be n-type impurities or p-type impurities.

The channel regions 1355 of the switching semiconductor layer 135a and the driving semiconductor layer 135b may include polysilicon not doped with impurities, that is, an intrinsic semiconductor.

The source regions 1356 and the drain regions 1357 of the switching semiconductor layer 135a and the driving semiconductor layer 135b may include polysilicon doped with conductive impurities, that is, an impurity semiconductor.

A gate insulating layer 140 may be formed on the switching semiconductor layer 135a and the driving semiconductor layer 135b in order to secure insulation from gate electrodes. The gate insulating layer 140 may be a single layer or layers including an inorganic material such as silicon oxide, silicon nitride, and/or silicon oxynitride.

A gate line 121, a switching gate electrode 125a protruding from the gate line 121, a first capacitor electrode 128 and a driving gate electrode 125b protruding from the first capacitor electrode 128 may be formed on the gate insulating layer 140.

The gate line 121 and the first capacitor electrode 128 formed on the gate insulating layer 140 may be made of a metal. The metal may include molybdenum (Mo). The metal may include at least one of gold (Au), silver (Ag), aluminum (Al), chromium (Cr), titanium (Ti), nickel (Ni), neodymium (Nd) and copper (Cu) or may include an alloy of the same.

Each of the gate line 121 and the first capacitor electrode 128 may be formed as a single layer. However, embodiments are not limited thereto, and each of the gate line 121 and the first capacitor electrode 128 may also be formed as a multilayer in which two or more of metals and alloys may be stacked.

Each of the gate line 121 and the first capacitor electrode 128 may be a multilayer of niobium-aluminum (Nb/Al), tantalum-aluminum (Ta/Al), or titanium-titanium nitride-aluminum (Ti/TiN/Al).

In an embodiment, other wirings may be formed of the same or similar material and on the same layer as the gate line 121 and the first capacitor electrode 128.

The gate line 121 may extend in a horizontal direction and may transmit a scan signal to the switching transistor T1. Here, the gate line 121 may include the switching gate electrode 125a protruding to the switching semiconductor layer 135a.

The driving gate electrode 125b may protrude from the first capacitor electrode 128 to the driving semiconductor layer 135b.

The switching gate electrode 125a and the driving gate electrode 125b may overlap the channel regions 1355, respectively.

A first interlayer insulating film 160 and a second interlayer insulating film 180 may be disposed on the gate line 121, the switching gate electrode 125a, the first capacitor electrode 128 and the driving gate electrode 125b.

The pixel bridge wirings PB described above may be disposed between the first interlayer insulating film 160 and the second interlayer insulating film 180.

The pixel bridge wirings PB may be made of a metal. The metal may include molybdenum (Mo). The metal may include at least one of gold (Au), silver (Ag), aluminum (Al), chromium (Cr), titanium (Ti), nickel (Ni), neodymium (Nd) and copper (Cu) or may include an alloy of the same.

Each of the pixel bridge wirings PB may be formed as a single layer. However, embodiments are not limited thereto, and each of the pixel bridge wirings PB may also be formed as a multilayer in which two or more of metals and alloys may be stacked.

According to an embodiment, each of the pixel bridge wirings PB may be a multilayer of niobium-aluminum (Nb/Al), tantalum-aluminum (Ta/Al), titanium-titanium nitride-aluminum (Ti/TiN/Al), or titanium-aluminum-titanium (Ti/Ai/Ti). The resistivity of the multilayer may be substantially the same as the resistivity of electrodes (or wirings) provided on the second interlayer insulating film 180 to be described later.

The thickness of the pixel bridge wirings PB in the third direction DR3 may be substantially the same as the thickness, in the third direction DR3, of electrodes (second conductive layer) provided on the second interlayer insulating film 180. For example, the thickness of the pixel bridge wirings PB in the third direction DR3 may be about 6000 Å.

The position of the pixel bridge wirings PB is not limited to the above position. For example, the pixel bridge wirings PB may also be disposed on the gate insulating layer 140.

For example, the pixel bridge wirings PB may be formed of the same material and on the same layer as the gate line 121 and the first capacitor electrode 128.

The first interlayer insulating film 160 and the second interlayer insulating film 180 may be made of an inorganic material such as silicon oxide, silicon nitride and/or silicon oxynitride.

Source contact holes 61 and drain contact holes 62 respectively exposing the source regions 1356 and the drain regions 1357 may be formed in the first interlayer insulating film 160, the second interlayer insulating film 180 and the gate insulating layer 140.

A storage contact hole 63 partially exposing the first capacitor electrode 128 may be formed in the first interlayer insulating film 160 and the second interlayer insulating film 180.

A data line 171 including a switching source electrode 176a, a driving voltage line 172 including a driving source electrode 176b and a second capacitor electrode 178, a switching drain electrode 177a connected to the first capacitor electrode 128, and a driving drain electrode 177b may be provided on the second interlayer insulating film 180.

The electrodes (or the wirings) provided on the second interlayer insulating film 180 may be made of a metal. The metal may include aluminum (Al). The electrodes (or the wirings) may be made of at least one of gold (Au), silver (Ag), molybdenum (Mo), chromium (Cr), titanium (Ti), nickel (Ni), neodymium (Nd) and copper (Cu) or may be made of an alloy of these metals. Each of the electrodes (or the wirings) may be formed as a single layer. However, embodiments are not limited thereto, and each of the electrodes (or the wirings) may also be formed as a multilayer in which two or more of metals and alloys may be stacked.

Although not illustrated in the drawings, electrodes (or wirings) other than the data line 171, the driving voltage line 172, etc. described above may be provided on the second interlayer insulating film 180 and may be made of the same or similar material as the data line 171, the driving voltage line 172, etc.

The data line 171 may transmit a data signal and extend in a direction intersecting the gate line 121. The driving voltage line 172 is designed to transmit a driving voltage, is separated from the data line 171, and extends parallel to the data line 171.

The switching source electrode 176a may protrude from the data line 171 toward the switching semiconductor layer 135a, and the driving source electrode 176b may protrude from the driving voltage line 172 toward the driving semiconductor layer 135b.

The switching source electrode 176a and the driving source electrode 176b may be connected to the source regions 1356 through the source contact holes 61, respectively.

The switching drain electrode 177a may face the switching source electrode 176a, and the driving drain electrode 177b may face the driving source electrode 176b.

The switching drain electrode 177a and the driving drain electrode 177b may be connected to the drain regions 1357 through the drain contact holes 62, respectively.

The switching drain electrode 177a may extend to be electrically connected to the first capacitor electrode 128 and the driving gate electrode 125b through the contact hole 63 formed in the first interlayer insulating film 160 and the second interlayer insulating film 180.

The second capacitor electrode 178 protrudes from the driving voltage line 172 to overlap the first capacitor electrode 128. Therefore, the first capacitor electrode 128 and the second capacitor electrode 178 may form a storage capacitor Cst having the first interlayer insulating film 160 and the second interlayer insulating film 180 as a dielectric.

The switching semiconductor layer 135*a*, the switching gate electrode 125*a*, the switching source electrode 176*a*, and the switching drain electrode 177*a* may form the switching transistor T1.

The driving semiconductor layer 135*b*, the driving gate electrode 125*b*, the driving source electrode 176*b*, and the driving drain electrode 177*b* may form a driving transistor T2.

The switching transistor T1 and the driving transistor T2 may correspond to switching elements.

Although not illustrated, a passivation layer may be disposed on the switching source electrode 176*a*, the driving source electrode 176*b*, the switching drain electrode 177*a* and the driving drain electrode 177*b*.

The passivation layer may be an inorganic insulating layer made of an inorganic material. The inorganic material may be polysiloxane, silicon nitride, silicon oxide, silicon oxynitride, or any other suitable material known or appreciated by those of ordinary skill in the art. A protective layer 190 may be formed on the second interlayer insulating film 180.

The protective layer 190 may be an organic insulating layer made of an organic material. The organic material may be an organic insulating material such as a polyacrylic compound, a polyimide compound, a fluorocarbon compound such as Teflon®, or a benzocyclobutene compound.

A first pixel electrode 710 may be formed on the protective layer 190.

The first pixel electrode 710 may include a transparent conductive material such as indium tin oxide (ITO), indium zinc oxide (IZO), zinc oxide (ZnO) or indium oxide ($In_2O_3$) or a reflective metal such as lithium (Li), calcium (Ca), lithium fluoride/calcium (LiF/Ca), lithium fluoride/aluminum (LiF/Al), aluminum (Al), silver (Ag), magnesium (Mg) or gold (Au).

The first pixel electrode 710 may be electrically connected to the driving drain electrode 177*b* of the driving thin-film transistor T2 through a pixel electrode contact hole 181 formed in the protective layer 190 and may serve as an anode of an organic light emitting diode 70.

A pixel defining layer 350 may be formed on the protective layer 190 and edges of the first pixel electrode 710. The pixel defining layer 350 may include an opening that exposes the first pixel electrode 710. For example, the pixel defining layer 350 may define a pixel region corresponding to each pixel.

The pixel defining layer 350 may be an organic insulating layer made of an organic material. The organic material may be an organic insulating material such as a polyacrylic compound, a polyimide compound, a fluorocarbon compound such as Teflon®, or a benzocyclobutene compound.

An organic light emitting layer 720 may be provided in the opening of the pixel defining layer 350.

The organic light emitting layer 720 may include a low molecular weight material or a high molecular weight material. Examples of the low molecular weight material may include copper phthalocyanine (CuPc), N,N'-di(naphthalene-1-yl)-N,N'-diphenyl-benzidine (NPB), and tris-8-hydroxyquinoline aluminum ($Alq_3$). Examples of the high molecular weight material may include PEDOT, poly-phenylenevinylene (PPV), and polyfluorene.

The organic light emitting layer 720 may be provided as a single layer, but may also be provided as a multilayer including various functional layers. When the organic light emitting layer 720 is provided as a multilayer, it may have a structure in which a hole injection layer, a hole transport layer, an emission layer, an electron transport layer, and an electron injection layer are stacked in a single or composite structure.

When the organic light emitting layer 720 includes all of the above layers, the hole injection layer may be located on the first pixel electrode 710 which is the anode, and the hole transport layer, the emission layer, the electron transport layer and the electron injection layer may be sequentially stacked on the hole injection layer.

The organic light emitting layer 720 may include a red organic light emitting layer which emits red light, a green organic light emitting layer which emits green light, and a blue organic light emitting layer which emits blue light. The red organic light emitting layer, the green organic light emitting layer and the blue organic light emitting layer may respectively be formed in a red pixel, a green pixel and a blue pixel to realize a color image.

The red organic light emitting layer, the green organic light emitting layer and the blue organic light emitting layer of the organic light emitting layer 720 may all be stacked together in each of the red pixel, the green pixel, and the blue pixel. For example, a red color filter, a green color filter, or a blue color filter may be formed in each pixel to realize a color image.

In another example, a white organic light emitting layer which emits white light may be formed in all of a red pixel, a green pixel and a blue pixel, and a red color filter, a green color filter and a blue color filter may be formed in each pixel to realize a color image.

The white organic light emitting layer described in the another example may not only be formed as a single organic light emitting layer, but may also be composed of organic light emitting layers stacked to emit white light.

For example, the white organic light emitting layer may include a combination of at least one yellow organic light emitting layer and at least one blue organic light emitting layer to emit white light, a combination of at least one cyan organic light emitting layer and at least one red organic light emitting layer to emit white light, or a combination of at least one magenta organic light emitting layer and at least one green organic light emitting layer to emit white light.

A second pixel electrode 730 may be provided on the pixel defining layer 350 and the organic light emitting layer 720.

The second pixel electrode 730 may be made of a metal layer such as silver (Ag), magnesium (Mg), aluminum (Al), platinum (Pt), palladium (Pd), gold (Au), nickel (Ni), neodymium (Nd), iridium (Ir) or chromium (Cr) or a transparent conductive layer such as indium tin oxide (ITO), indium zinc oxide (IZO), zinc oxide (ZnO) or indium tin zinc oxide (ITZO). In an embodiment, the second pixel electrode 730 may be a multilayer including two or more metal thin layers, such as a triple layer of indium tin oxide-silver-indium tin oxide (ITO/Ag/ITO).

Since the first pixel electrode 710 may be the anode of the organic light emitting diode 70 as described above, the second pixel electrode 730 may be a cathode of the organic light emitting diode 70.

However, in some cases, the first pixel electrode 710 may be the cathode, and the second pixel electrode 720 may be the anode.

The first pixel electrode 710, the organic light emitting layer 720, and the second pixel electrode 730 form the organic light emitting diode 70.

A thin-film encapsulation layer TFE may be disposed on the second pixel electrode 730 to protect the organic light emitting diode 70. The thin-film encapsulation layer TFE may be a single layer including any one of a first inorganic layer, an organic layer and a second inorganic layer or may be a multilayer in which two or more of the above layers may be stacked.

FIG. 8 is a schematic cross-sectional view taken along line I-I' of FIG. 3. FIG. 9 is a schematic cross-sectional view taken along line II-II' of FIG. 3.

The stacked structure of the first wirings BL1 (BL1_a through BL1_d) and the second wirings BL2 (BL2_a through BL2_d) formed on the fourth bridge BR2_4 of the second island IS2 will now be described in detail with reference to FIGS. 8 and 9.

The buffer layer 120, the gate insulating layer 140, the first interlayer insulating film 160 and the second interlayer insulating film 180 may include an opening OA which exposes the fourth bridge BR2_4 of the second island IS2 of the base layer 110.

For example, the buffer layer 120, the gate insulating layer 140, the first interlayer insulating film 160 and the second interlayer insulating film 180 may be provided mainly on the first island IS1 and the second island IS2 and may be provided on only part of the first bridge BR1_1 of the first island IS1 and the fourth bridge BR2_4 of the second island IS2.

The second wirings BL2 may be disposed on the base layer 110 in the opening OA to extend along the shape of the bridges BR, i.e., the fourth bridges BR2_4 of the second island IS2 in the first direction DR1.

The second wirings BL2 and the pixel bridge wirings PB may be simultaneously formed of the same or similar material. For example, the second wirings BL2 may be made of a metal. The metal may include molybdenum (Mo). The metal may include at least one of gold (Au), silver (Ag), aluminum (Al), chromium (Cr), titanium (Ti), nickel (Ni), neodymium (Nd) and copper (Cu) or may include an alloy of the same.

For example, each of the second wirings BL2 may be formed as a single layer. However, embodiments are not limited thereto, and each of the second wirings BL2 may also be formed as a multilayer in which two or more of metals and alloys may be stacked.

According to an embodiment, each of the second wirings BL2 may be a multilayer of niobium-aluminum (Nb/Al), tantalum-aluminum (Ta/Al), titanium-titanium nitride-aluminum (Ti/TiN/Al), or titanium-aluminum-titanium (Ti/Ai/Ti). The resistivity of the multilayer may be substantially the same as the resistivity of the electrodes (or the wirings) provided on the second interlayer insulating film 180.

The thickness of the second wirings BL2 in the third direction DR3 may be substantially the same as the thickness, in the third direction DR3, of the electrodes (second conductive layer) provided on the second interlayer insulating film 180. For example, the thickness of the second wirings BL2 in the third direction DR3 may be about 6000 Å.

The second wirings BL2 may also be formed of the same material as the gate line 121 and the gate electrodes 125a and 125b at the same time depending on process order.

The second protective layer 200 may be disposed on the second wirings BL2. The second protective layer 200 may completely cover upper and side surfaces of the second wirings BL2. The first wirings BL1 may be disposed on the second protective layer 200 to overlap the second wirings BL2 in the third direction DR3. The first contact holes CNT1 may be formed in the second protective layer 200 to partially expose the second wirings BL2. The first wirings BL1 may be physically and electrically connected to the second wirings BL2 through the first contact holes CNT1. Although two first contact holes CNT1 are illustrated in FIG. 9, embodiments are not limited thereto. For example, the number of the first contact holes CNT1 may be increased or decreased in proportion to the length of the bridges BR.

The second protective layer 200 may cover the opening OA and cover at least part of edges of the buffer layer 120 and the gate insulating layer 140.

The second protective layer 200 may be an organic insulating layer made of an organic material. The organic material may be an organic insulating material such as a polyacrylic compound, a polyimide compound, a fluorocarbon compound such as Teflon®, or a benzocyclobutene compound.

The first wirings BL1 provided on the bridges BR may extend in the first direction DR1 along the shape of the bridges BR.

The first wirings BL1 provided on the bridges BR may extend to islands IS. The first wirings BL1 extending to the islands IS may be located on the second interlayer insulating film 180. The pixel bridge wirings PB may be disposed on the first interlayer insulating film 160. The second contact holes CNT2 may be formed in the second interlayer insulating film 180 to partially expose the pixel bridge wirings PB. The first wirings BL1 may be physically and electrically connected to the pixel bridge wirings PB through the second contact holes CNT2.

The pixel bridge wirings PB may be disposed on the first interlayer insulating film 160 as illustrated in FIG. 9. However, the position of the pixel bridge wirings PB is not limited to this position. For example, the pixel bridge wirings PB may be disposed on the gate insulating layer 140. The pixel bridge wirings PB may be formed of the same or similar material and on the same layer as the gate line 121 and the first capacitor electrode 128.

The first wirings BL1 may be made of the same or similar material as the source electrodes 176a and 176b of transistors, the data line 171, the second capacitor electrode 178, the driving voltage line 172, and the drain electrodes 177a and 177b of the transistors, all of which are provided on the second interlayer insulating film 180.

For example, the first wirings BL1 may include aluminum (Al). The first wirings BL1 may be made of at least one of gold (Au), silver (Ag), molybdenum (Mo), chromium (Cr), titanium (Ti), nickel (Ni), neodymium (Nd) and copper (Cu) or may be made of an alloy of these metals. Each of the first wirings BL1 may be formed as a single layer. However, embodiments are not limited thereto, and each of the first wirings BL1 may also be formed as a multilayer in which two or more of metals and alloys may be stacked.

The first protective layer 190 may be formed on side and upper surfaces of the first wirings BL1.

The first protective layer 190 provided on the first wirings BL1 may extend to the islands IS. For example, the first wirings BL1 may be protected by the first protective layer 190.

The second pixel electrode 730 may be provided on the first protective layer 190. The second pixel electrode 730 may cover the base layer 110, the first protective layer 190 and the second protective layer 200.

The thin-film encapsulation layer TFE may be disposed on the second pixel electrode 730.

The buffer layer 120, the gate insulating layer 140, the first interlayer insulating film 160 and the second interlayer insulating film 180 which may include an inorganic material may be collectively referred to as an inorganic insulating layer. The first protective layer 190 and the second protective layer 200 may be collectively referred to as an organic material layer.

According to an embodiment, the inorganic insulating layer may have the opening OA corresponding to the bridges BR, and the bridges BR may include the organic material layer that fills at least part of the opening OA.

The display device 1 according to the disclosure is stretchable. If the inorganic insulating layer is continuous from the islands IS to the bridges BR without having the opening OA in the bridges BR and if the first and second wirings BL1 and BL2 are located on the inorganic insulating layer in the bridges BR, a large tensile stress may be applied to the first wirings BL1 when the substrate 100 is stretched.

As an example, since the hardness of the inorganic insulating layer is higher than that of the organic material layer, cracks are very likely to be created in the inorganic insulating layer existing in the bridges BR. When cracks are created in the inorganic insulating layer, cracks may also be created in the first wirings BL1 disposed on the inorganic insulating layer. Therefore, the probability that defects such as breaking of the first wirings BL1 will occur may be very high.

However, in the display device 1 according to the embodiment, the inorganic insulating layer may be provided mainly on the islands IS of the base layer 110 which are hardly subjected to stress even when the substrate 100 is stretched and the inorganic insulating layer may be provided minimally on the bridges BR which are subjected to stress, so that the first wirings BL1 may be located on the organic material layer (e.g., the second protective layer 200) in the bridges BR. Since the organic material layer is hardly likely to have cracks due to an organic material contained in the organic material layer, the creation of cracks in the first wirings BL1 located on the organic material layer may be prevented, or the probability of crack creation may be minimized.

The organic material layer may be provided between the second wirings BL2 and the base layer 110. For example, the second wirings BL2 may be disposed on the organic material layer formed on the base layer 110. Since the hardness of the organic material layer is lower than that of the inorganic insulating layer, the organic material layer may absorb tensile stress applied to the substrate 100, thereby effectively minimizing the concentration of tensile stress on the second wirings BL2.

For example, in the display device 1 according to the embodiment, the second wirings BL2 may be provided or disposed to prevent the possible creation of cracks in the first wirings BL1. Therefore, when cracks are created in the first wirings BL1, electrical signals can be transmitted through the second wirings BL2. For example, when cracks are created between two first contact holes CNT1 illustrated in FIG. 9, electrical signals transmitted through the first wirings BL1 may be transmitted through the second wirings BL2. Therefore, the reliability of the display device 1 can be improved.

Electrodes/wirings formed on the gate insulating layer 140 and the first interlayer insulating film 160 may be collectively referred to as a first conductive layer. Electrodes/wirings formed on the second interlayer insulating film 180 may be collectively referred to as a second conductive layer.

According to an embodiment, the first wirings BL1 provided on the bridges BR may be made of the same or similar material as the material contained in the second conductive layer.

According to an embodiment, the first wirings BL1 provided on the bridges BR may include a material having a high elongation percentage so as to prevent defects such as creation of cracks in the first wirings BL1 and breaking of the first wirings BL1.

According to an embodiment, the second wirings BL2 provided on the bridges BR may include the same or similar material as the material contained in the first conductive layer. Since the second wirings BL2 perform the function of the first wirings BL1 when cracks may be created in the first wirings BL1, the resistivity of the second wirings BL2 may be substantially the same as that of the first wirings BL1. For example, each of the second wirings BL2 may be a multi-layer of niobium-aluminum (Nb/Al), tantalum-aluminum (Ta/Al), titanium-titanium nitride-aluminum (Ti/TiN/Al), or titanium-aluminum-titanium (Ti/Ai/Ti).

In the islands IS, the first conductive layer may be formed of a material having a lower elongation percentage than the first wirings BL1 but having different electrical/physical properties from the first wirings BL1 so as to increase the efficiency of electrical signal transmission or reduce a defect occurrence rate in a manufacturing process.

For example, the first conductive layer provided on the islands IS may include molybdenum, and the second conductive layer and the first wirings BL1 may include aluminum.

The structure of each of the second through fourth bridges BR1_2 or BR2_2 through BR1_4 or BR2_4 may be similar to the structure of the first bridge BR1_1 or BR2_1 described above. For example, the inorganic insulating layer may be removed from the second through fourth bridges BR1_2 or BR2_2 through BR1_4 or BR2_4, the second wirings BL2 may be disposed on the base layer 110, and the second protective layer 200 may be disposed on the second wirings BL2. The first wirings BL1 may be disposed on the second protective layer 200 to overlap the second wirings BL2 in the third direction DR3 and may be physically and electrically connected to the second wirings BL2 through the first contact holes CNT1 formed in the second protective layer 200. The number of the first wirings BL1 provided in the second through fourth bridges BR1_2 through BR1_4 may be equal to or different from the number of the first wirings BL1 provided in the first bridge BR1_1.

A method of manufacturing the display device 1 according to an embodiment will now be described with reference to FIGS. 10 through 19.

FIGS. 10 through 19 illustrate a method of manufacturing a display device according to an embodiment.

Figure 10:
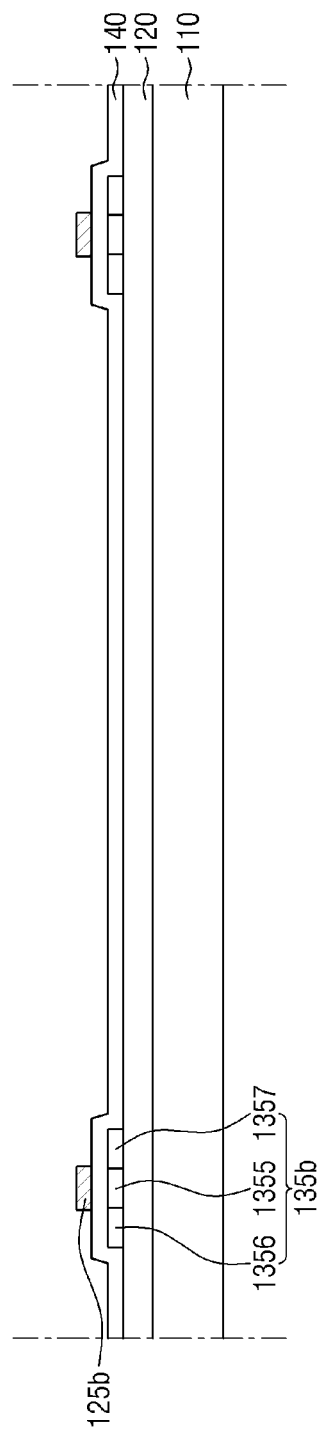
FIGS. 10 through 19 illustrate a method of manufacturing a display device according to an embodiment.
Figure 11:
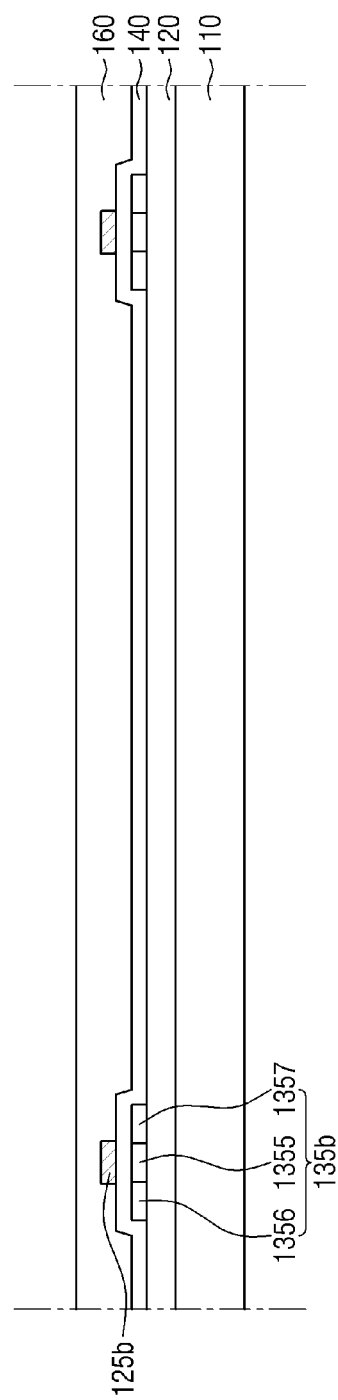

Referring to FIGS. 10 and 11, a buffer layer 120 may be disposed on a base layer 110. The buffer layer 120 may increase the smoothness of an upper surface of the base layer 110 or prevent or minimize the penetration of impurities from the base layer 110 into semiconductor layers 135*a* and 135*b* of thin-film transistors T1.

Driving semiconductor layers 135*b* may be formed on the buffer layer 120. A channel region 1355 of each of the driving semiconductor layers 135*b* may include polysilicon not doped with impurities, that is, an intrinsic semiconductor. A source region 1356 and a drain region 1357 of each of the driving semiconductor layers 135*b* may include polysilicon doped with conductive impurities, that is, an impurity semiconductor.

A gate insulating layer 140 may be disposed on the buffer layer 120 and the driving semiconductor layers 135*b*, and gate electrodes 125*b* may be formed on the gate insulating layer 140.

A first interlayer insulating film 160 may be formed on the gate insulating layer 140 and the gate electrodes 125b as shown in FIG. 11.

Figure 12:
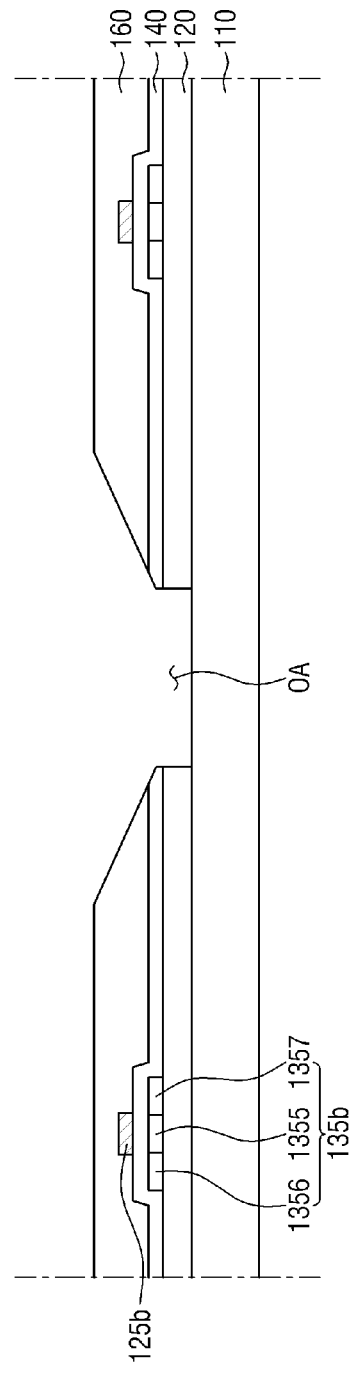
Figure 13:
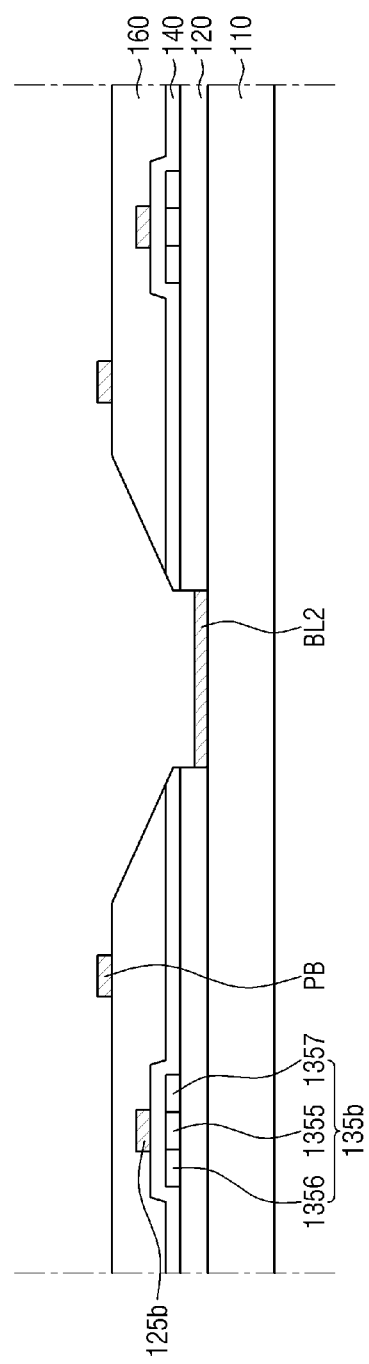

Referring to FIGS. 12 and 13, an opening OA exposing a bridge region BR of the base layer 110 may be formed in the buffer layer 120, the gate insulating layer 140 and the first interlayer insulating film 160 by a photolithography process, for example. Here, a boundary between each island region IS and the bridge region BR may have a gentle slope as may be understood by those of ordinary skill in the art. Therefore, a disconnection or a crack of first wirings BL1 may be prevented.

After the formation of the opening OA, a first conductive layer may be patterned to simultaneously form pixel bridge wirings PB on the first interlayer insulating film 160 and form second wirings BL2 on the base layer 110 in the opening OA as shown in FIG. 13. The pixel bridge wirings PB and the second wirings BL2 may be made of a metal. The metal may include molybdenum (Mo). The metal may include at least one of gold (Au), silver (Ag), aluminum (Al), chromium (Cr), titanium (Ti), nickel (Ni), neodymium (Nd) and copper (Cu) or may include an alloy of the same.

For example, each of the pixel bridge wirings PB may be formed as a single layer. However, embodiments are not limited thereto, and each of the pixel bridge wirings PB may also be formed as a multilayer in which two or more of metals and alloys may be stacked.

For example, each of the pixel bridge wirings PB may be a multilayer of niobium-aluminum (Nb/Al), tantalum-aluminum (Ta/Al), titanium-titanium nitride-aluminum (Ti/TiN/Al), or titanium-aluminum-titanium (Ti/Ai/Ti). The resistivity of the multilayer may be substantially the same as the resistivity of aluminum (Al).

Figure 14:
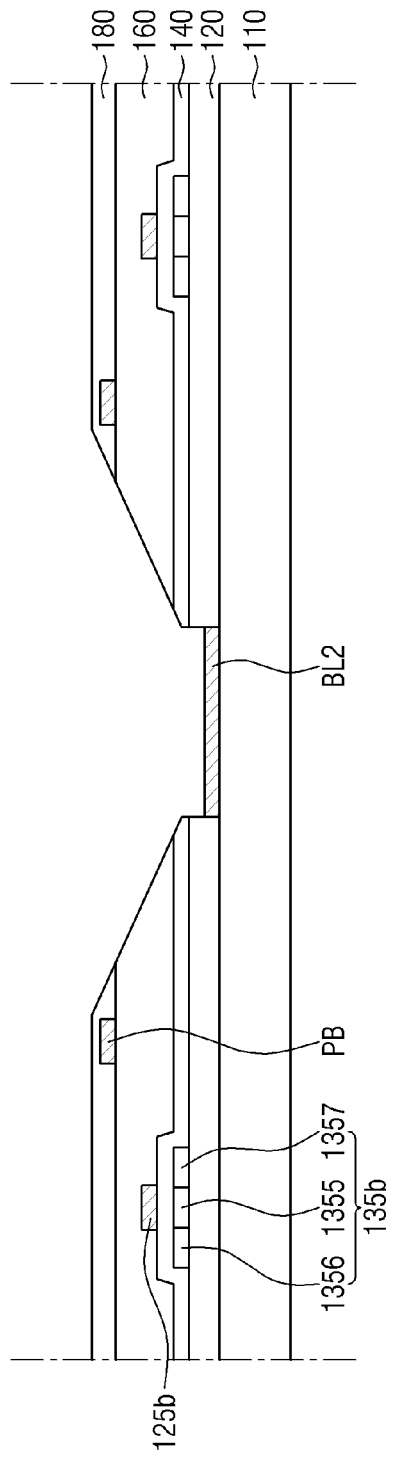
Figure 15:
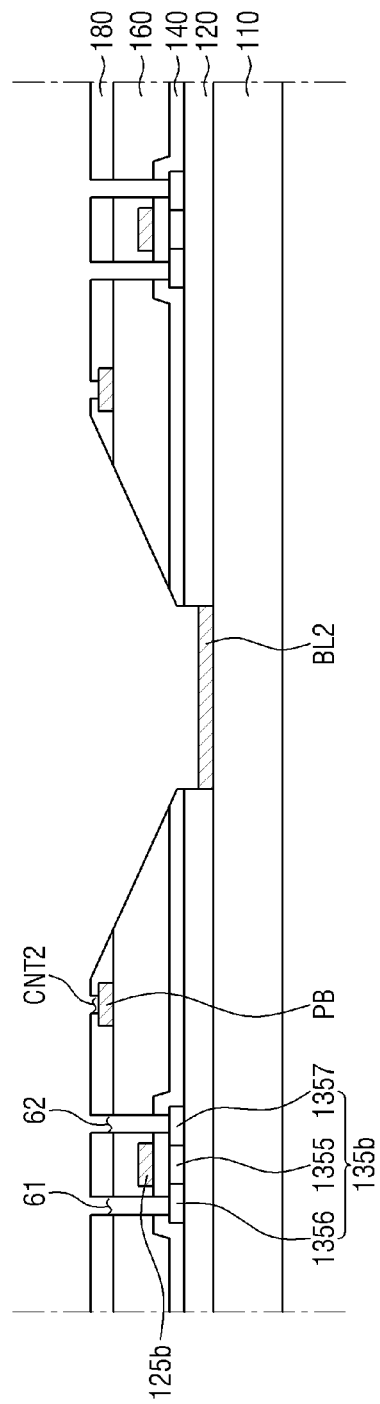

Referring to FIGS. 14 and 15, a second interlayer insulating film 180 may be patterned so that the second interlayer insulating film 180 is formed on the first interlayer insulating film 160, or, is formed only on the first interlayer insulating film 160. Source contact holes 61, drain contact holes 62 and second contact holes CNT2 may be simultaneously formed using a semi-transmissive mask such as a halftone mask or a slit mask. For example, the transmittance of a mask used to form the source contact holes 61 which partially expose the source regions 1356 and the drain contact holes 62 which partially expose the drain regions 1357 in the gate insulating layer 140, the first interlayer insulating film 160 and the second interlayer insulating film 180 may be different from the transmittance of the mask used to form the second contact holes CNT2, which partially expose the pixel bridge wirings PB, in the second interlayer insulating film 180. Therefore, two mask processes may be reduced to one mask process.

Figure 16:
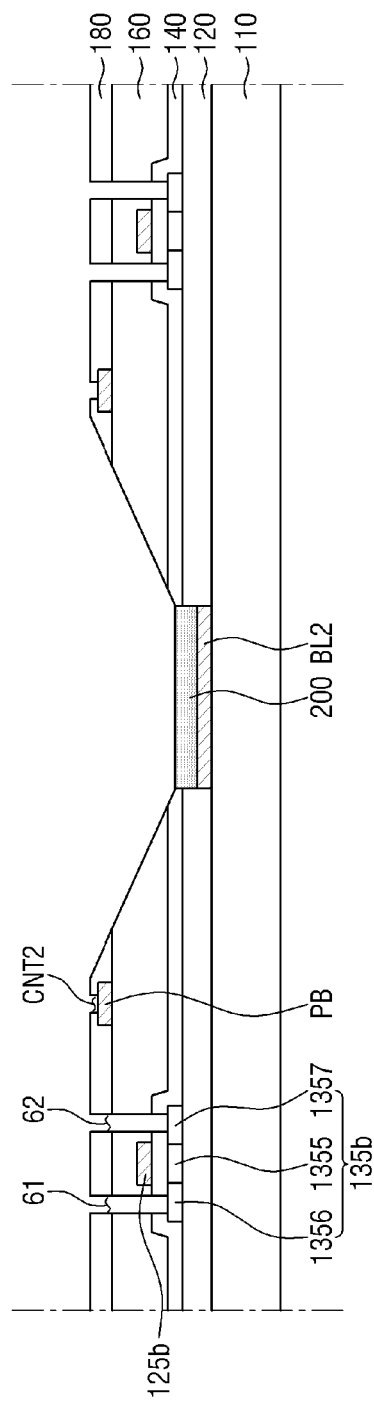
Figure 17:
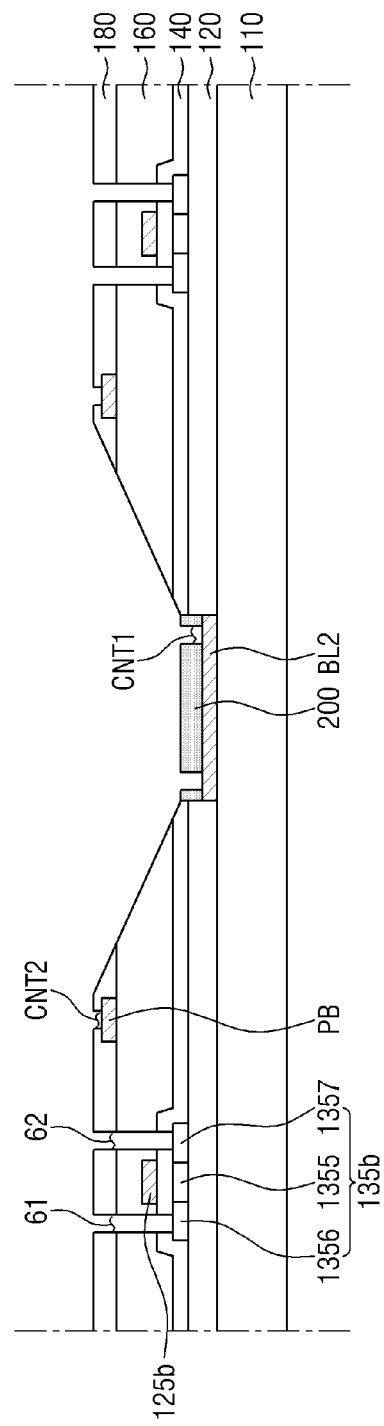

Referring to FIGS. 16 and 17, a second protective layer 200 is patterned on the base layer 110 in the opening OA. First contact holes CNT1 may be formed in the second protective layer 200 to partially expose the second wirings BL2. The number of the first contact holes CNT1 may be increased or decreased in proportion to the size of the opening OA.

Figure 18:
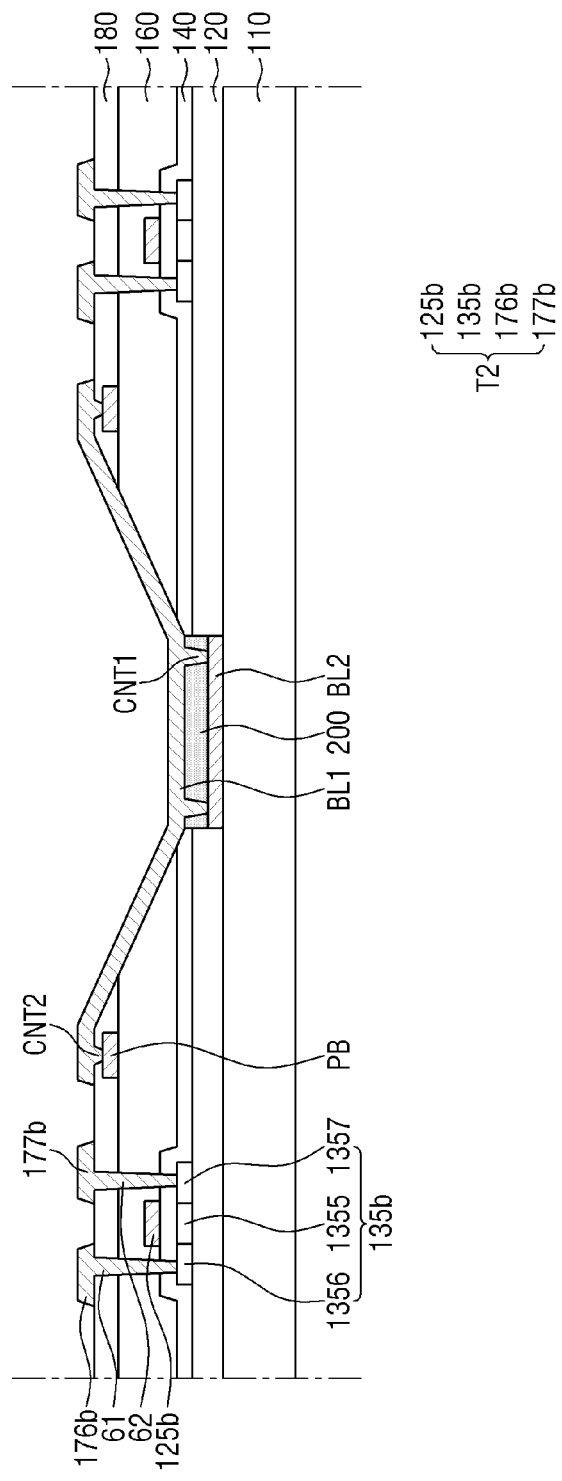
Figure 19:
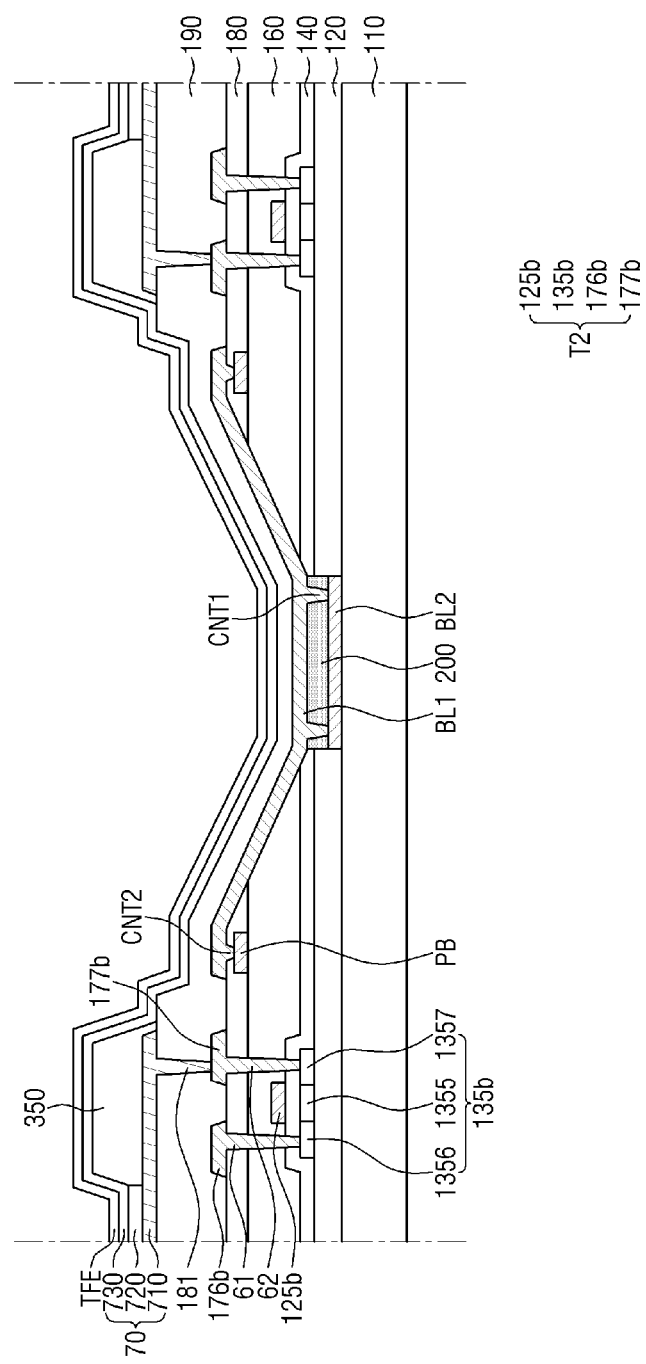

Referring to FIGS. 18 and 19, a second conductive layer is patterned on the base layer 110 having the source contact holes 61, the drain contact holes 62, the first contact holes CNT1 and the second contact holes CNT2, thereby forming source electrodes 176b connected to the source regions 1356 through the source contact holes 61, drain electrodes 177b connected to the drain regions 1357 through the drain contact holes 62, and the first wirings BL1 connected to the second wirings BL2 through the first contact holes CNT1 and connected to the pixel bridge wirings PB through the second contact holes CNT2.

The source electrodes 176b, the drain electrodes 177b and the first wirings BL1 may include aluminum (Al). The source electrodes 176b, the drain electrodes 177b and the first wirings BL1 may be made of at least one of gold (Au), silver (Ag), molybdenum (Mo), chromium (Cr), titanium (Ti), nickel (Ni), neodymium (Nd) and copper (Cu) or may be made of an alloy of these metals. Each of the source electrodes 176b, the drain electrodes 177b and the first wirings BL1 may be formed as a single layer. However, embodiments are not limited thereto, and each of the source electrodes 176b, the drain electrodes 177b and the first wirings BL1 may also be formed as a multilayer in which two or more of metals and alloys may be stacked.

A first protective layer 190 may be formed on the second interlayer insulating film 180, the source electrodes 176b, the drain electrodes 177b, and the first wirings BL1. Pixel electrode contact holes 181 may be formed in the first protective layer 190 to partially expose the drain electrodes 177b. First pixel electrodes 710 may be formed on the first protective layer 190 and may be physically and electrically connected to the drain electrodes 177b through the pixel electrode contact holes 181.

A pixel defining layer 350 may be formed on the protective layer 190 and edges of the first pixel electrodes 710. The pixel defining layer 350 may include openings, each exposing a first pixel electrode 710. For example, the pixel defining layer 350 may define a pixel region corresponding to each pixel.

An organic light emitting layer 720 may be provided in each opening of the pixel defining layer 350. The organic light emitting layer 720 may be formed by evaporation, screen printing, inkjet printing, laser induced thermal imaging (LITI), or any other suitable process that may be known and appreciated by those of ordinary skill in the art.

A second pixel electrode 730 may be provided on the pixel defining layer 350 and the organic light emitting layers 720. A thin-film encapsulation layer TFE that protects organic light emitting diodes may be disposed on the second pixel electrode 730. The thin-film encapsulation layer TFE may be a single layer including any one of a first inorganic layer, an organic layer and a second inorganic layer or may be a multilayer in which two or more of the above layers may be stacked.

Hereinafter, display devices according to embodiments will be described. In the following embodiments, a description of elements identical to those of the above-described embodiment will be omitted or given briefly. The following embodiments will be described, focusing mainly on differences from the above-described embodiment.

Figure 20:
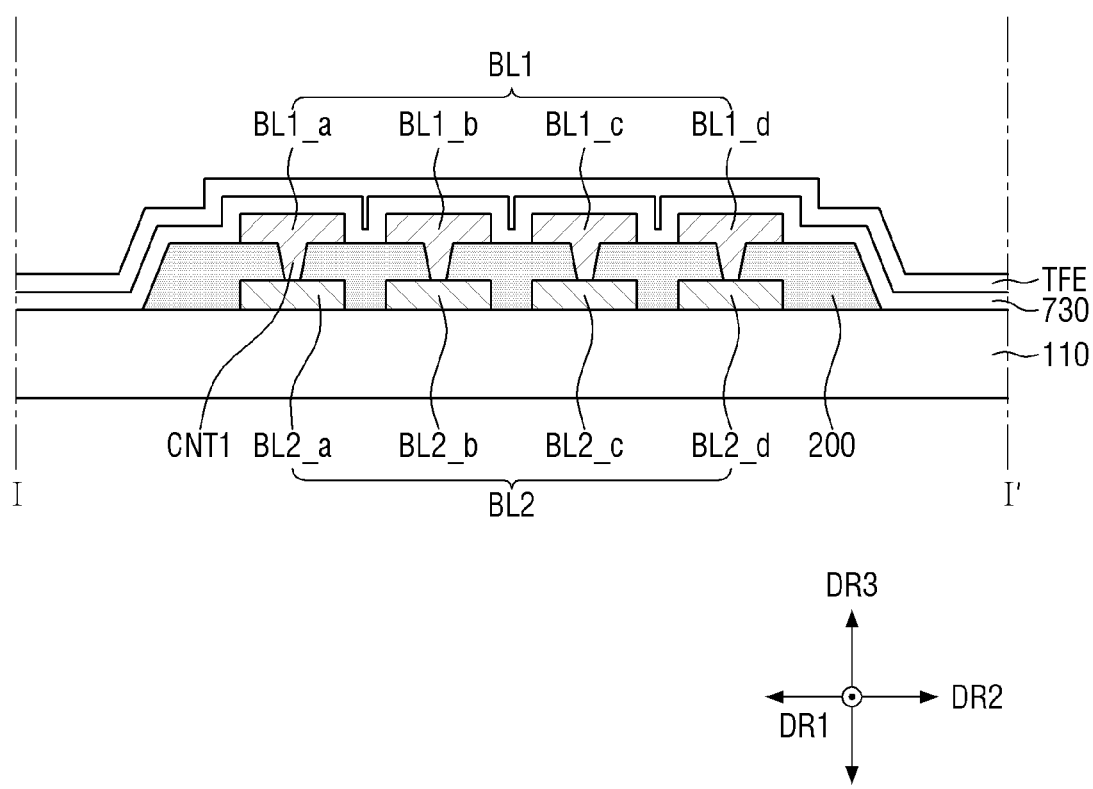
FIG. 20 is a schematic cross-sectional view taken along line I-I' of FIG. 3 according to an embodiment.
Figure 21:
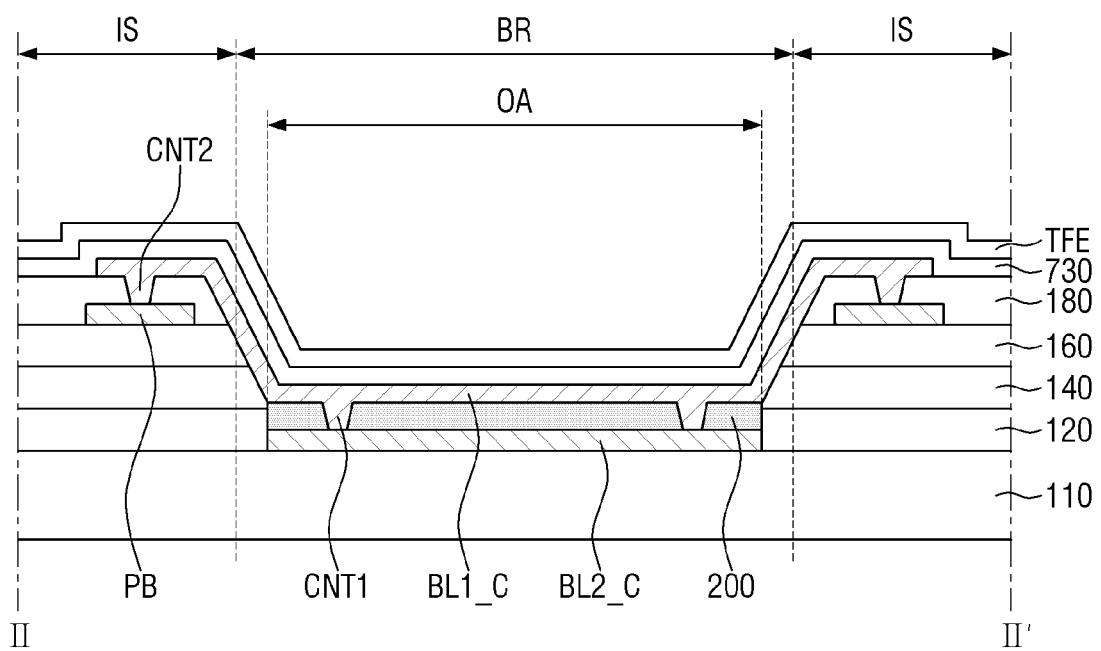
FIG. 21 is a schematic cross-sectional view taken along line II-II' of FIG. 3 according to an embodiment.
Figure 21:
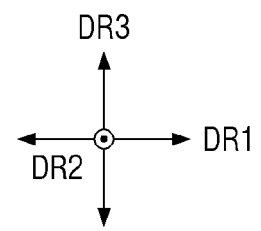

FIG. 20 is a schematic cross-sectional view taken along line I-I' of FIG. 3 according to an embodiment, and FIG. 21 is a schematic cross-sectional view taken along line II-IF of FIG. 3 according to an embodiment.

Referring to FIGS. 20 and 21, the embodiment is different from the embodiment of FIGS. 8 and 9 in that a first protective layer 190 is not provided on first wirings BL1 (BL1_a through BL1_d).

As an example, second wirings BL2 (BL2_a through BL2_d) may be disposed on a base layer 110. A second protective layer 200 may be disposed on side and upper surfaces of the second wirings BL2 (BL2_a through BL2_d). The first wirings BL1 (BL1_a through BL1_d) may be disposed on the second protective layer 200 to overlap the second wirings BL2 (BL2_a through BL2_d), respectively.

The term overlap may include layer, stack, face or facing, extending over, covering or partly covering or any other suitable term as would be appreciated and understood by those of ordinary skill in the art. The terms 'do not overlap' may include 'apart from' or 'set aside from' or 'offset from' and any other suitable equivalents as would be appreciated and understood by those of ordinary skill in the art.

The second protective layer 200 may include first contact holes CNT1 partially exposing the second wirings (BL2_a through BL2_d). The first wirings BL1 (BL1_a through BL1_d) may be physically and electrically connected to the second wirings BL2 (BL2_a through BL2_d) through the first contact holes CNT1, respectively.

The first protective layer 190 may be disposed on island regions IS1 and IS2 and may not be disposed on a bridge region BR, or, only on island regions IS1 and IS2 and may not be disposed on a bridge region BR. For example, the first protective layer 190 may be formed on a second interlayer insulating film 180, a source electrode 176b and a drain electrode 177b. A second pixel electrode 730 may be directly disposed on the first wirings BL1 (BL1_a through BL1_d). A thin-film encapsulation layer TFE may be disposed on the second pixel electrode 730. Since a process of forming the first protective layer 190 on the base layer 110 in an opening region OA is omitted, process errors may be reduced.

Figure 22:
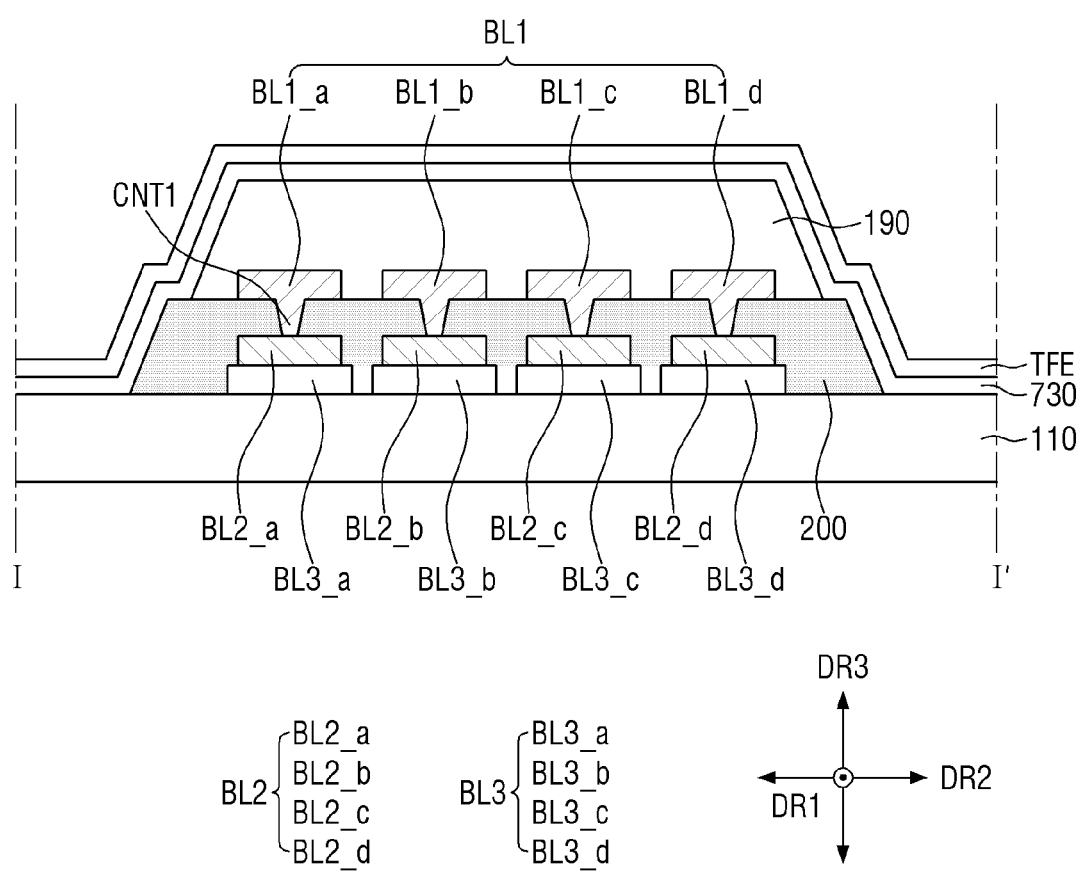
FIG. 22 is a schematic cross-sectional view taken along line I-I' of FIG. 3 according to an embodiment.
Figure 23:
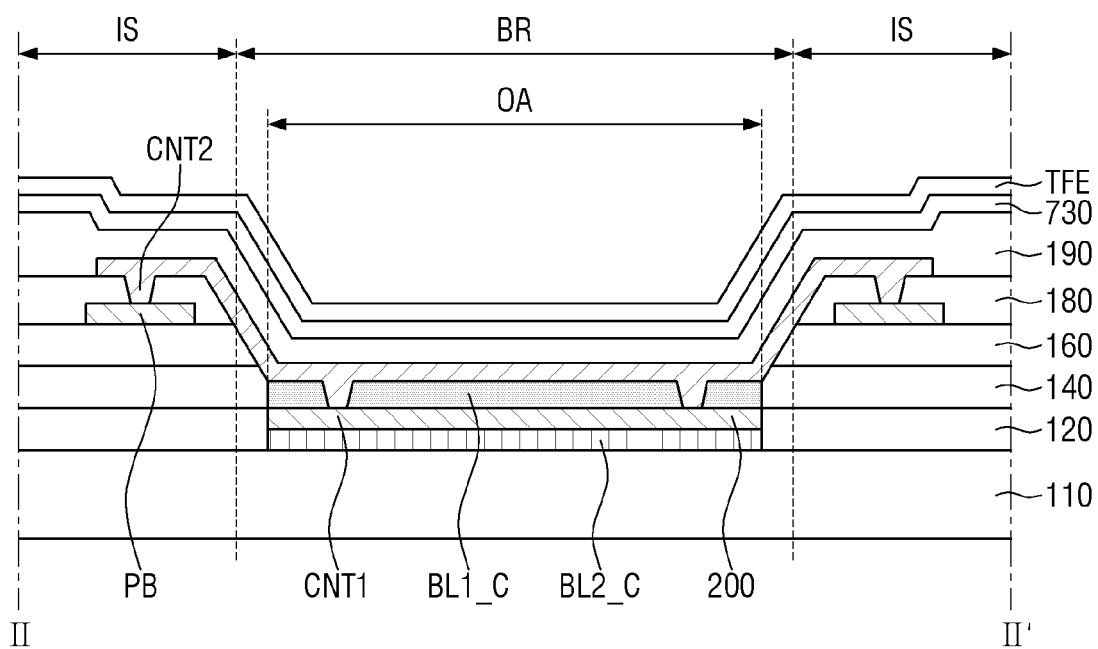
FIG. 23 is a schematic cross-sectional view taken along line II-II' of FIG. 3 according to an embodiment.
Figure 23:
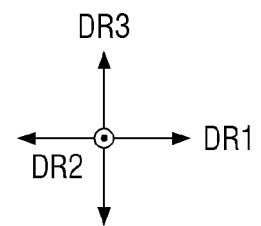

FIG. 22 is a schematic cross-sectional view taken along line I-I' of FIG. 3 according to an embodiment, and FIG. 23 is a schematic cross-sectional view taken along line II-II' of FIG. 3 according to an embodiment.

Referring to FIGS. 22 and 23, the embodiment is different from the embodiment of FIGS. 8 and 9 in that third wirings BL3 are provided between second wirings BL2 and a base layer 110.

For example, the third wirings BL3 (BL3_a through BL3_d) may be disposed on the base layer 110. The third wirings BL3 (BL3_a through BL3_d) may be formed of the same or similar material as a gate line 121 and gate electrode 125a and 125b at the same time.

For example, the third wirings BL3 (BL3_a through BL3_d) may be made of a metal. The metal may include molybdenum (Mo). The metal may include at least one of gold (Au), silver (Ag), aluminum (Al), chromium (Cr), titanium (Ti), nickel (Ni), neodymium (Nd) and copper (Cu) or may include an alloy of the same.

Each of the third wirings BL3 (BL3_a through BL3_d) may be formed as a single layer. However, embodiments are not limited thereto, and each of the third wirings BL3 (BL3_a through BL3_d) may also be formed as a multilayer in which two or more of metals and alloys may be stacked.

Each of the third wirings BL3 (BL3_a through BL3_d) may be a multilayer of niobium-aluminum (Nb/Al), tantalum-aluminum (Ta/Al), or titanium-titanium nitride-aluminum (Ti/TiN/Al).

The resistivity of the multilayer may be substantially the same as the resistivity of electrodes (second conductive layer) provided on a second interlayer insulating film 180. According to an embodiment, the thickness of the third wirings BL3 (BL3_a through BL3_d) in the third direction DR3 may be half the thickness, in the third direction DR3, of the electrodes (second conductive layer) provided on the second interlayer insulating film 180 to be described later. For example, the thickness of the third wirings BL3 (BL3_a through BL3_d) in the third direction DR3 may be in a range of about 2000 Å to about 3000 Å.

The second wirings BL2 (BL2_a through BL2_d) may be disposed on the third wirings BL3 (BL3_a through BL3_d). The second wirings BL2 (BL2_a through BL2_d) may overlap the third wirings BL3 (BL3_a through BL3_d) in the third direction DR3, respectively.

According to an embodiment, the thickness of the second wirings BL (BL2_a through BL2_d) in the third direction DR3 may be half the thickness, in the third direction DR3, of the electrodes (second conductive layer) provided on the second interlayer insulating film 180. For example, the thickness of the second wirings BL2 (BL2_a through BL2_d) in the third direction DR3 may be in a range of about 2000 Å to about 3000 Å.

A second protective layer 200 may be disposed on side and upper surfaces of the second wirings BL2 (BL2_a through BL2_d) and on side surfaces and part of upper surfaces of the third wirings BL3 (BL3_a through BL3_d).

First wirings BL1 (BL1_a through BL1_d) may be disposed on the second protective layer 200 to overlap the second wirings BL2 (BL2_a through BL2_d), respectively. The second protective layer 200 may include first contact holes CNT1 partially exposing the second wirings BL2 (BL2_a through BL2_d). The first wirings BL1 (BL1_a through BL1_d) may be physically and electrically connected to the second wirings BL2 (BL2_a through BL2_d) through the first contact holes CNT1, respectively.

For ease of description, the first through third wirings BL1 through BL3 are illustrated as having the same thickness in the third direction DR3 in FIGS. 22 and 23. However, the sum of the thickness of the second wirings BL2 (BL2_a through BL2_d) in the third direction DR3 and the thickness of the third wirings BL3 (BL3_a through BL3_d) in the third direction DR3 may be substantially equal to the thickness, in the third direction DR3, of the electrodes (second conductive layer) provided on the second interlayer insulating film 180. For example, the sum of the thickness of the second wirings BL2 (BL2_a through BL2_d) in the third direction DR3 and the thickness of the third wirings BL3 (BL3_a through BL3_d) in the third direction DR3 may be substantially equal to the thickness of the first wirings BL1 (BL1_a through BL1_d) in the third direction DR3.

When each of the second wirings BL2 (BL2_a through BL2_d) and the third wirings BL3 (BL3_a through BL3_d) is formed as a multilayer of niobium-aluminum (Nb/Al), tantalum-aluminum (Ta/Al), or titanium-titanium nitride-aluminum (Ti/TiN/Al), its resistivity is the same as the resistivity of the electrodes (second conductive layer) provided on the second interlayer insulating film 180. Therefore, a total resistance value of the second wirings BL2 (BL2_a through BL2_d) and the third wirings BL3 (BL3_a through BL3_d) may be substantially the same as a resistance value of the first wirings (BL1_a through BL1_d). Therefore, even when cracks are created in the first wirings BL1 (BL1_a through BL1_d), electrical signals can still be transmitted through the second wirings BL2 (BL2_a through BL2_d) and the third wirings BL3 (BL3_a through BL3_d) under the same resistance condition.

Figure 24:
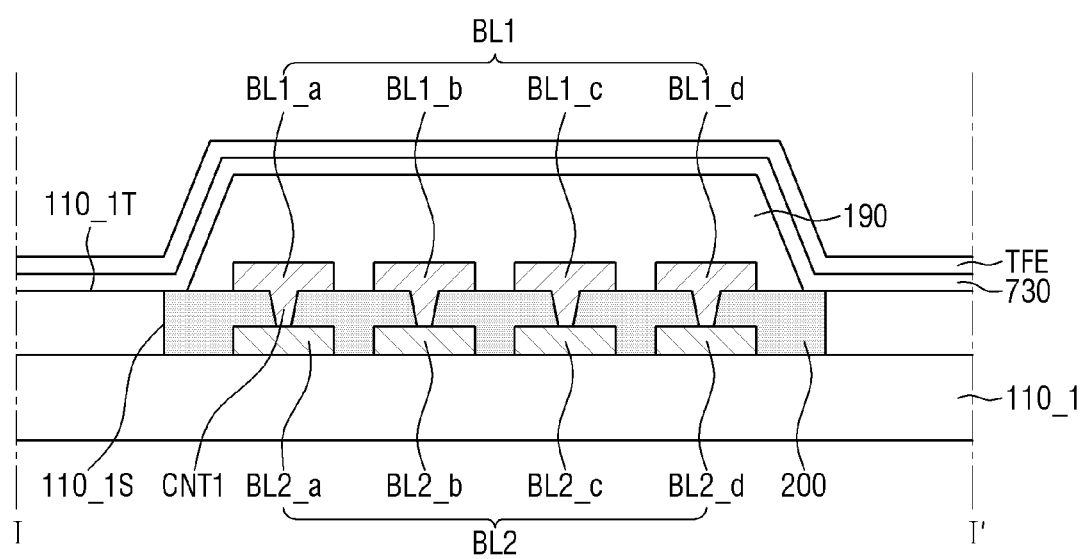
FIG. 24 is a schematic cross-sectional view taken along line I-I' of FIG. 3 according to an embodiment.
Figure 24:
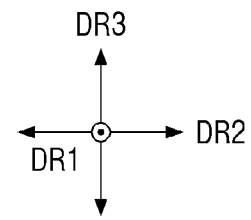
Figure 25:
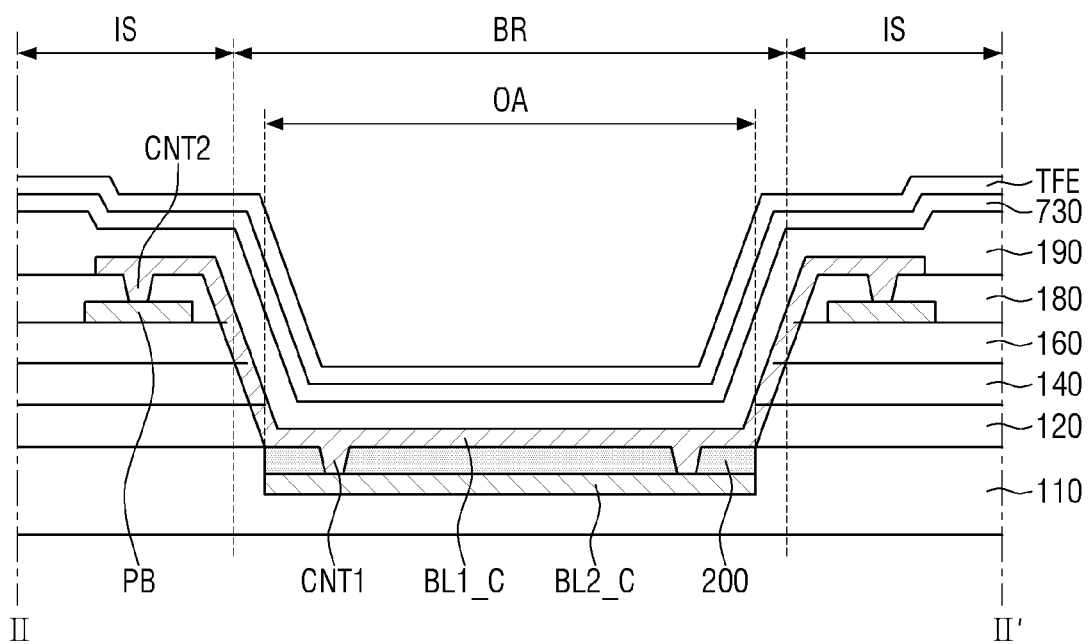
FIG. 25 is a schematic cross-sectional view taken along line II-II' of FIG. 3 according to an embodiment.

FIG. 24 is a schematic cross-sectional view taken along line I-I' of FIG. 3 according to an embodiment, and FIG. 25 is a schematic cross-sectional view taken along line II-II' of FIG. 3 according to an embodiment.

Referring to FIGS. 24 and 25, the embodiment is different from the embodiment of FIGS. 8 and 9 in that second wirings BL2 and a second protective layer 200 are formed within a base layer 110.

As an example, the second wirings BL2 (BL2_a through BL2_d) and the second protective layer 200 may be disposed within the base layer 110. The base layer may comprise a groove, which may be formed lower than an upper surface of the base layer, in a part of the bridge region BR. The second wirings BL2 (BL2_*a* through BL2_*d*) and the first organic insulating layer 200 may be disposed in the groove of the base layer 110. The groove may be defined by the opening OA in a part of the bridge region BR.

The second protective layer 200 may be disposed on side and upper surfaces of the second wirings BL2 (BL2_*a* through BL2_*d*). Side surfaces of the second protective layer 200 may be in contact with inner side surfaces 110_1S of the base layer 110.

First wirings BL1 (BL1_*a* through BL1_*d*) may be disposed on the second protective layer 200 to overlap the second wirings BL2 (BL2_*a* through BL2_*d*), respectively. The second protective layer 200 may include first contact holes CNT1 partially exposing the second wirings BL2 (BL2_*a* through BL2_*d*). The first wirings BL1 (BL1_*a* through BL1_*d*) may be physically and electrically connected to the second wirings BL2 (BL2_*a* through BL2_*d*) through the first contact holes CNT1, respectively.

A first protective layer 190 may be disposed on the second protective layer 200 and the first wirings BL1. A second pixel electrode 730 may be disposed on the first protective layer 190. The second pixel electrode 730 may not contact the side surfaces of the second protective layer 200. A thin-film encapsulation layer TFE may be disposed on the second pixel electrode 730.

A neutral plane subjected to minimum tensile stress may be formed above an upper surface 110_1T of the base layer 110 in an in-folding display device. For example, the neutral plane may be formed in a buffer layer 120 on which a switching transistor T1, a driving transistor T2, etc. are formed. On the other hand, the neutral plane may be formed below the upper surface 110_1T of the base layer 110 in an out-folding display device. Therefore, if the second wirings BL2 (BL2_*a* through BL2_*d*) and the second protective layer 200 are disposed within the base layer 110, the probability that cracks will be created in the second wirings BL2 (BL2_*a* through BL2_*d*) may be reduced. Therefore, this structure may be effective in the out-folding display device.

Although the above described embodiments have been disclosed for illustrative purposes, those skilled in the art will appreciate that various modifications, additions and substitutions are possible, without departing from the scope and spirit of the invention as disclosed in the accompanying claims.

What is claimed is:

1. A display device comprising:
   a base layer including a display area and a non-display area;
   a plurality of islands and a plurality of bridges in the display area, the plurality of islands and the plurality of bridges being disposed on the base layer with the plurality of bridges connecting the plurality of islands to each other;
   an inorganic insulating layer disposed on the base layer, the inorganic insulating layer comprises an opening exposing the base layer of a bridge region including the bridges;
   a plurality of pixels disposed on the plurality of islands;
   first wirings disposed on the plurality of bridges, the first wirings being disposed between two adjacent islands and electrically connecting adjacent pixels;
   second wirings disposed in the opening with at least one second wiring of the second wirings directly contacting the two adjacent islands; and
   a first organic insulating layer disposed between the first wirings and the second wirings;
   a plurality of first contact holes formed in the first organic insulating layer and located in the bridge region, wherein
   the first wirings and the second wirings are connected to each other through the plurality of first contact holes located in the opening.

2. The display device of claim 1, wherein
   the inorganic insulating layer is disposed mainly on the plurality of islands of the base layer, and
   the first organic insulating layer is disposed mainly on the plurality of bridges of the base layer.

3. The display device of claim 1, further comprising a plurality of pixel bridge wirings which connect at least one pixel of the plurality of pixels to the first wirings.

4. The display device of claim 3, wherein
   at least one inorganic insulating layer is disposed between the first wirings and the pixel bridge wirings, and
   the first wirings and the pixel bridge wirings are connected through a plurality of second contact holes formed in the at least one inorganic insulating layer.

5. The display device of claim 3, wherein the second wirings are made of a same material as the pixel bridge wirings.

6. The display device of claim 5, wherein the second wirings comprise any one of niobium-aluminum (Nb/Al), tantalum-aluminum (Ta/Al), titanium-titanium nitride-aluminum (Ti/TiN/Al), and titanium-aluminum-titanium (Ti/Ai/Ti).

7. The display device of claim 1, wherein resistivity of the first wirings is substantially the same as resistivity of the second wirings.

8. The display device of claim 1, wherein a height of the first wirings in a thickness direction is substantially the same as a height of the second wirings in the thickness direction.

9. The display device of claim 1, wherein the first wirings and the second wirings overlap in the opening in a thickness direction.

10. The display device of claim 1, wherein
    the islands have a quadrilateral shape, and
    at least one bridge of the plurality of bridges is connected to one side of at least one island of the plurality of islands.

11. The display device of claim 1, wherein a second organic insulating layer is disposed on the first organic insulating layer and the first wirings.

12. The display device of claim 11, wherein a thin-film encapsulation layer is disposed on the second organic insulating layer.

13. The display device of claim 1, further comprising third wirings between the second wirings and the base layer of the opening.

14. The display device of claim 13, wherein the second wirings and the third wirings overlap in a thickness direction.

15. The display device of claim 14, wherein a sum of a height of the second wirings in the thickness direction and a height of the third wirings in the thickness direction is substantially equal to a height of the first wirings in the thickness direction.

16. The display device of claim 1, wherein the base layer comprises a groove, which is formed lower than an upper surface of the base layer, in a part of the bridge region.

17. The display device of claim 16, wherein the second wirings and the first organic insulating layer are disposed in the groove.

18. The display device of claim 1, wherein the inorganic insulating layer comprises a buffer layer, a gate insulating layer, and at least one interlayer insulating film stacked sequentially.

19. The display device of claim 18, wherein
each of the pixels of the plurality of pixels comprises a transistor, and
each transistor comprises a semiconductor layer provided on the buffer layer, a gate electrode provided on the gate insulating layer, and a source electrode and a drain electrode formed on the interlayer insulating film.

20. The display device of claim 19, wherein the first wirings are made of a same material as a material contained in the source electrode and the drain electrode.

21. The display device of claim 19, wherein the second wirings are made of a same material as the gate electrode.

22. The display device of claim 1, wherein
each of the plurality of pixels include a switching transistor, a driving transistor, a storage capacitor, and an organic light emitting diode,
each organic light emitting diode includes an organic material that emits light of any one or more of primary colors of red, green, and blue, and
the display device displays an image using a spatial sum of the primary colors.

23. The display device of claim 1, wherein the first organic insulating layer is thinner than the inorganic insulating layer.

24. The display device of claim 1, wherein the first organic insulating layer does not extend directly over an adjacent island.

25. The display device of claim 1, wherein the first wirings make direct contact with an incline side surface of each of the two adjacent islands.

26. The display device of claim 1, wherein the first contact hole penetrates the first organic insulating layer in the opening.

* * * * *

UNITED STATES PATENT AND TRADEMARK OFFICE
CERTIFICATE OF CORRECTION

| | | |
|---|---|---|
| PATENT NO. | : 11,737,320 B2 | |
| APPLICATION NO. | : 16/842308 | |
| DATED | : August 22, 2023 | |
| INVENTOR(S) | : Gwui Hyun Park et al. | |

It is certified that error appears in the above-identified patent and that said Letters Patent is hereby corrected as shown below:

On the Title Page

Item (72) In the third inventor's name listed:
"Chui Won Park" should be listed as "Chul Won Park".

Signed and Sealed this
Third Day of October, 2023

Katherine Kelly Vidal
*Director of the United States Patent and Trademark Office*